(12) United States Patent
Kim et al.

(10) Patent No.: US 10,575,370 B2
(45) Date of Patent: *Feb. 25, 2020

(54) ELECTRICAL CONDUCTORS, ELECTRICALLY CONDUCTIVE STRUCTURES, AND ELECTRONIC DEVICES INCLUDING THE SAME

(71) Applicant: SAMSUNG ELECTRONICS CO., LTD., Suwon-si, Gyeonggi-do (KR)

(72) Inventors: Se Yun Kim, Seoul (KR); Jong Wook Roh, Anyang-si (KR); Jongmin Lee, Hwaseong-si (KR); Doh Won Jung, Seoul (KR); Sungwoo Hwang, Suwon-si (KR); Chan Kwak, Yongin-si (KR); Jinyoung Hwang, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 584 days.

This patent is subject to a terminal disclaimer.

(21) Appl. No.: 15/275,551

(22) Filed: Sep. 26, 2016

(65) Prior Publication Data

US 2017/0094723 A1 Mar. 30, 2017

(30) Foreign Application Priority Data

Sep. 25, 2015 (KR) .................. 10-2015-0136922

(51) Int. Cl.
*B32B 3/00* (2006.01)
*H01B 1/08* (2006.01)
(Continued)

(52) U.S. Cl.
CPC ............ *H05B 3/12* (2013.01); *B22F 1/0025* (2013.01); *C01G 23/04* (2013.01); *C01G 55/004* (2013.01);
(Continued)

(58) Field of Classification Search
None
See application file for complete search history.

(56) References Cited

U.S. PATENT DOCUMENTS 5,995,359 A 11/1999 Klee et al.
7,514,065 B2 4/2009 Takasu et al.
(Continued)

FOREIGN PATENT DOCUMENTS

EP 2765582 A1 8/2014
EP 2975506 A1 1/2016
(Continued)

OTHER PUBLICATIONS

Akatsuka, K., et al, "Electrochemical and photoelectrochemical study on exfoliated Nb3O8 nanosheet", Journal of Physics and Chemistry of Solids, 69, 2008, pp. 1288-1291.
(Continued)

*Primary Examiner* — Joseph M Pelham
(74) *Attorney, Agent, or Firm* — Cantor Colburn LLP

(57) ABSTRACT

An electrical conductor including:
a first conductive layer including a plurality of metal nanowires; and
a second conductive layer disposed on a surface of the first conductive layer, wherein the second conductive layer includes a plurality of metal oxide nanosheets,
wherein in the first conductive layer, a metal nanowire of the plurality of metal nanowires contacts at least two metal oxide nanosheets of the plurality of metal oxide nanosheets, and
wherein the plurality of metal oxide nanosheets includes an electrical connection between contacting metal oxide nanosheets.

20 Claims, 27 Drawing Sheets

(51) Int. Cl.
*H01B 1/16* (2006.01)
*H01B 1/00* (2006.01)
*G06F 3/041* (2006.01)
*G06F 3/045* (2006.01)
*G06F 3/047* (2006.01)
*H05B 3/12* (2006.01)
*H01B 5/14* (2006.01)
*B22F 1/00* (2006.01)
*C01G 23/04* (2006.01)
*C01G 55/00* (2006.01)
*H01B 1/02* (2006.01)

(52) U.S. Cl.
CPC ............... *H01B 1/02* (2013.01); *H01B 1/08* (2013.01); *H01B 1/16* (2013.01); *H01B 5/14* (2013.01); *B22F 2301/255* (2013.01); *G06F 3/041* (2013.01); *G06F 2203/04102* (2013.01)

(56) References Cited

U.S. PATENT DOCUMENTS

| | | | |
|---|---|---|---|
| 7,585,349 B2 | 9/2009 | Xia et al. | |
| 8,048,511 B2 | 11/2011 | Uetsuka et al. | |
| 8,728,358 B2 | 5/2014 | Ikisawa et al. | |
| 9,892,815 B2* | 2/2018 | Kim | H01B 1/00 |
| 9,900,979 B2* | 2/2018 | Sohn | H05K 1/09 |
| 10,070,522 B2* | 9/2018 | Jung | H05K 1/09 |
| 2009/0233086 A1 | 9/2009 | Hirai | |
| 2010/0200286 A1 | 8/2010 | Melcher et al. | |
| 2012/0024572 A1* | 2/2012 | Naoi | C08K 3/08 174/126.1 |
| 2012/0043530 A1* | 2/2012 | Badre | H01B 1/122 257/40 |
| 2012/0153236 A1 | 6/2012 | Cakmak et al. | |
| 2012/0300168 A1 | 11/2012 | Hoke | |
| 2014/0212672 A1 | 7/2014 | Han et al. | |
| 2014/0313562 A1 | 10/2014 | Ruoff et al. | |
| 2015/0090479 A1 | 4/2015 | Lee et al. | |
| 2016/0293286 A1 | 10/2016 | Sohn et al. | |
| 2017/0040089 A1* | 2/2017 | Lee | H01L 51/5203 |
| 2017/0092387 A1* | 3/2017 | Kim | H01B 1/00 |
| 2017/0135208 A1* | 5/2017 | Jung | C09D 7/70 |
| 2017/0194074 A1* | 7/2017 | Sohn | H01B 1/02 |
| 2017/0204241 A1* | 7/2017 | Nicolay | H01M 4/485 |

FOREIGN PATENT DOCUMENTS

| | | | |
|---|---|---|---|
| JP | 2010-132514 A | 6/2010 | |
| KR | 10-1016603 B1 | 2/2011 | |
| KR | 1020130107460 A | 10/2013 | |
| WO | 2009/065180 A1 | 5/2009 | |
| WO | 2010/119687 A1 | 10/2010 | |
| WO | WO-2015142077 A1 * | 9/2015 | H01B 1/22 |

OTHER PUBLICATIONS

European Search Report for European Patent Application No. 16190650.8 dated Jan. 31, 2017.
Zhang, Y., et al, "Plasmon enhanced photoelectrochemical sensing of mercury (II) ions in human serum based on Au@Ag nanorods modified TiO2 nanosheets film", Biosensors and Bioelectronics, 79, 2016, 866-873.
Zhu. R., et al, "Fused Silver Nanowires with Metal Oxide Nanoparticles and Organic Polymers for Highly Transparent Conductors", ACS NANO, vol. 5, No. 12, 2011, 9877-9882.
Deng et al., "RuO2/graphene hybrid material for high performance electrochemical capacitor", Journal of Power Sources, 248, 2014, pp. 407-415.
Fukuda et al., "Swelling, intercalation, and exfoliation behavior of layered ruthenate derived from layered potassium rughenate", Journal of Solid State Chemistry, 182, 2009, pp. 2997-3002.
Fukuda et al., "Synthesis of Nanosheet Crystallites of Ruthenate with an a-NaFeO2-Related Structure and Its Electrochemical Supercapacitor Property", Inorg. Chem., 49, 2010, pp. 4391-4393.
Osada et al., "Exfoliated oxide nanosheets: new solution to nanoelectronics", Journal of Materials Chemistry, 19, 2009, pp. 2503-2511.
Chinese Office Action dated May 23, 2019 for Chinese Patent Application No. 201610851418.2.

* cited by examiner

ELECTRICAL CONDUCTORS, ELECTRICALLY CONDUCTIVE STRUCTURES, AND ELECTRONIC DEVICES INCLUDING THE SAME

CROSS-REFERENCE TO RELATED APPLICATION

This application claims priority to and the benefit of Korean Patent Application No. 10-2015-0136922, filed in the Korean Intellectual Property Office on Sep. 25, 2015, and all the benefits accruing therefrom under 35 U.S.C. § 119, the entire contents of which are incorporated herein by reference.

BACKGROUND

1. Field

Electrical conductors, electrically conductive structures, and an electronic device including the same are disclosed.

2. Description of the Related Art

An electronic device, such as a flat panel display such as an LCD or LED display, a touch screen panel, a solar cell, a transparent transistor, and the like may include an electrically conductive thin film or a transparent electrically conductive thin film. It is desirable for a material of an electrically conductive film to have high light transmittance (e.g., greater than or equal to about 80% in a visible light region) and low specific resistance (e.g., less than or equal to about $1\times10^{-4}$ Ωcm). Currently available oxide materials used in transparent electrically conductive thin films include indium tin oxide (ITO), tin oxide ($SnO_2$), zinc oxide (ZnO), and the like. ITO is a transparent electrode material and is a transparent semiconductor having a wide bandgap of 3.75 eV, and may be manufactured in a large area using a sputtering process. However, in terms of application to a flexible touch panel, or a UD-grade high resolution display, ITO has poor flexibility and will inevitably cost more due to limited reserves of indium. Therefore, development of an alternative material is desired.

Recently, a flexible electronic device, e.g., a foldable or bendable electronic device, has been drawing attention as a next generation electronic device. Therefore, there is a need for a material having improved transparency, relatively high electrical conductivity, and suitable flexibility, as well as transparent electrode materials.

SUMMARY

An embodiment provides a flexible electrical conductor having improved conductivity and improved light transmittance.

Another embodiment provides a flexible and electrically conductive hybrid structure having improved conductivity and improved light transmittance.

Yet another embodiment provides an electronic device including the electrical conductor or the electrically conductive hybrid structure.

In an embodiment, an electrical conductor includes: a first conductive layer including a plurality of metal nanowires; a second conductive layer disposed on a surface of the first conductive layer, wherein the second conductive layer includes a plurality of metal oxide nanosheets, wherein in the first conductive layer a metal nanowire of the plurality of metal nanowires contacts at least two metal oxide nanosheets of the plurality of metal oxide nanosheets, and wherein the plurality of metal oxide nanosheets includes an electrical connection between contacting metal oxide nanosheets.

The metal may include silver (Ag), copper (Cu), gold (Au), aluminum (Al), cobalt (Co), palladium (Pd), or a combination thereof.

The electrical conductor may be a transparent conductive film.

The conductive metal nanowire may have a diameter of less than or equal to about 50 nanometers (nm) and a length of greater than or equal to about 1 micrometer (μm). The metal oxide nanosheets may have an average lateral size of greater than or equal to about 0.1 μm and less than or equal to about 100 μm, and may have an average thickness of less than or equal to about 3 nm.

The metal oxide nanosheets may have a standard deviation of less than or equal to about 2 μm in the lateral size.

The metal oxide nanosheets may have a standard deviation of less than or equal to about 0.5 μm in the lateral size.

The conductive metal nanowire may have an average length that is greater than the average lateral size of the plurality of metal oxide nanosheets.

The second conductive layer may be a discontinuous layer including an open space between the metal oxide nanosheets, and an area ratio of the open space with respect to the total area of the second conductive layer may be less than or equal to about 50%.

A metal nanowire of the plurality of metal nanowires of the first conductive layer may extend over the open space of the second conductive layer.

The thickness of the second conductive layer may be less than or equal to about 20 nm, and for example, less than or equal to about 5 nm.

The thickness of the first conductive layer may be less than or equal to about 200 nm, and for example, may be less than or equal to about 100 nm.

The electrical conductor may have sheet resistance of less than or equal to about 100 ohms per square (Ω/sq) and transmittance of greater than or equal to about 85%, with respect to light of a wavelength of 550 nm (for example, when the first and second conductive layers have a thickness of 100 nm or less).

The metal oxide nanosheets may include at least two types of C1 to C16 alkyl ammonium ions on a surface thereof.

The metal oxide nanosheets may include a tetramethyl ammonium ion and a tetrabutyl ammonium ion on a surface thereof.

The metal oxide nanosheets may include $Ti_xO_2$ (x=0.8 to 1.0), $Ti_3O_7$, $Ti_4O_9$, $Ti_5O_{11}$, $Ti_{1-x}Co_xO_2$ (0<x≤0.2), $Ti_{1-x}Fe_xO_2$ (0<x≤0.4), $Ti_{1-x}Mn_xO_2$ (0<x≤0.4), $Ti_{0.8-x/4}Fe_{x/2}Co_{0.2-x/4}O_2$ (x=0.2, 0.4, 0.6), $MnO_2$, $Mn_3O_7$, $Mn_{1-x}Co_xO_2$ (0<x≤0.4), $Mn_{1-x}Fe_xO_2$ (0<x≤0.2), $TiNbO_5$, $Ti_2NbO_7$, $TiTaO_5$, $Nb_3O_8$, $Nb_6O_{17}$, $TaO_3$, $LaNb_2O_7$, $La_{0.90}Eu_{0.05}Nb_2O_7$, $Eu_{0.56}Ta_2O_7$, $SrTa_2O_7$, $Bi_2SrTa_2O_9$, $Ca_2Nb_3O_{10}$, $Sr_2Nb_3O_{10}$, $NaCaTa_3O_{10}$, $CaLaNb_2TiO_{10}$, $La_2Ti_2NbO_{10}$, $Ba_5Ta_4O_{15}$, $W_2O_7$, $RuO_{2+x}$ (0≤x≤0.5), $Cs_4W_{11}O_{36}$, or a combination thereof.

At least one of the first conductive layer and the second conductive layer may further include a binder.

The electrical conductor may further include an overcoating layer including a thermosetting resin, an ultraviolet (UV)-curable resin, or a combination thereof on the first conductive layer.

The electrical conductor may have a resistance change of less than or equal to about 60% when it is folded to have a curvature radius of 1 mm.

The conductor may have a substrate disposed on a surface of the second conductive layer which is opposite to the first conductive layer.

In another embodiment, a one-dimensional-two-dimensional hybrid structure includes: a nanosheet layer including a plurality of metal oxide nanosheets, and a nanowire layer disposed on the nanosheet layer and including a plurality of metal nanowires, wherein in the nanowire layer a metal nanowire of the plurality of metal nanowires contacts at least two metal oxide nanosheets of the plurality of metal oxide nanosheets, and wherein the plurality of metal oxide nanosheets in the nanosheet layer includes an electrical connection between contacting metal oxide nanosheets.

In another embodiment, a heating element may include the aforementioned electrical conductor or the afomrementioned hybrid structure.

In another embodiment, an electronic device including the electrical conductor is provided.

In another embodiment, an electronic device including the hybrid structure is provided.

The electronic device may be a flat panel display, a touch screen panel, a solar cell, an e-window, an electrochromic mirror, a heat mirror, a transparent transistor, or a flexible display.

According to an embodiment, a combination of a plurality of (one-dimensional) metal nanowires and a plurality of (two-dimensional) metal oxide nanosheets may provide enhanced conductivity and enhanced transparency. In addition, even when a break of the 1D material occurs due to bending deformation of the conductor, the 2D oxide nanosheets provide an electrically conductive path and thus the conductor may an improved nanowire-based conductor.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
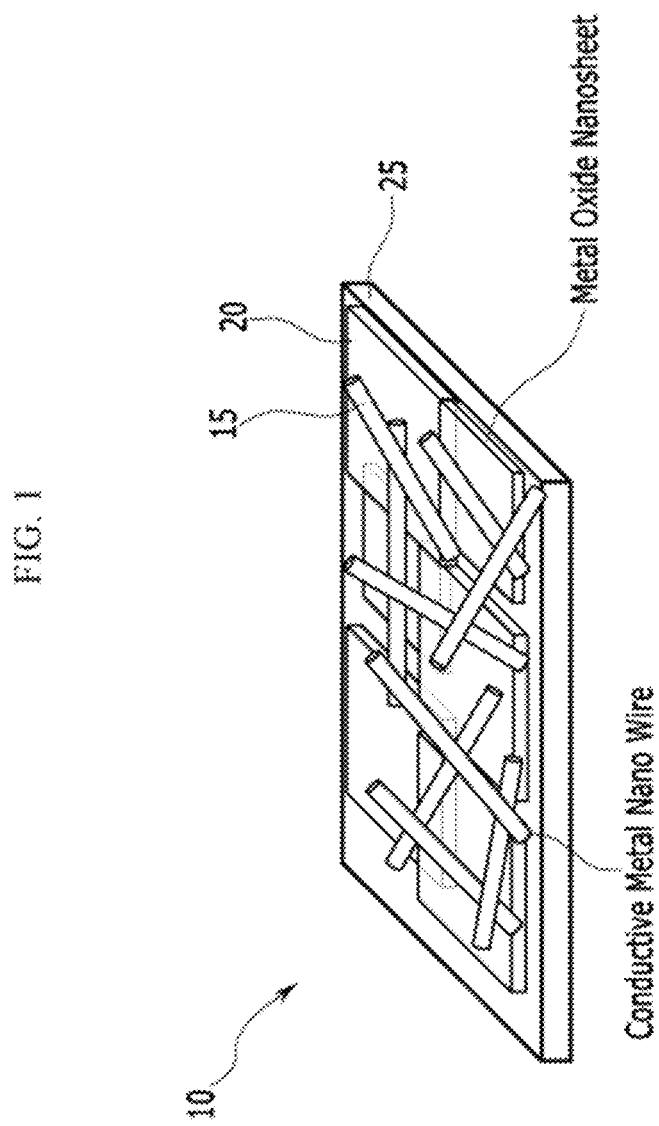
FIG. 1 is a schematic illustration of a conductor according to an embodiment.

Advantages and characteristics of this disclosure, and a method for achieving the same, will become evident referring to the following exemplary embodiments together with the drawings attached hereto. However, this disclosure may be embodied in many different forms and is not to be construed as limited to the embodiments set forth herein. If not defined otherwise, all terms (including technical and scientific terms) in the specification may be defined as those commonly understood by one skilled in the art. The terms defined in a dictionary are not to be interpreted ideally or exaggeratedly unless clearly defined otherwise. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the phrase "a first element is disposed on a second element" means that the first element is adjacent to (e.g., is in contact with) the second element and the upper and lower position therebetween is not defined.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as limiting to "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "sheet resistance" refers to a value determined by a 4-point probe method for a specimen having a predetermined size (e.g., a specimen of a width of 3.5 cm and a length of 3.5 cm or a specimen of a width of 10 cm and a length of 10 cm).

As used herein, a transmittance of a material is the value considering only the transmittance of a given material and excluding light absorption of a substrate.

In an embodiment, and as shown schematically in FIG. 1, an electrical conductor 10 comprises a first conductive layer comprising a plurality of one-dimensional (1 D) metal nanowires 15, and a second conductive layer disposed on a surface of the first conductive layer and including a plurality of two-dimensional (2D) metal oxide nanosheets 20. The electrical conductor may optionally further comprise a substrate 25. In the second conductive layer, the metal oxide nanosheets (e.g., at least a portion of the plurality of metal oxide nanosheets) are in contact with one another to provide an electrical connection (e.g., electrical conduction path). As used herein, "the nanosheets being in contact with one another to provide an electrical connection (e.g., the electrically conduction path)" refers to the case where the contact between the nanosheets is made to provide an electrical conduction path, and thereby the conductive layer has an electrical conductivity (for example, of a sheet resistance of less than or equal to about 1,000,000 ohm/sq.) In the first conductive layer, a metal nanowire of the plurality of metal nanowires contacts at least two (i.e., a plurality of) metal oxide nanosheets of the plurality of metal oxide nanosheets. In other words, at least a portion of the plurality of metal nanowires included in the first conductive layer contact at least two metal oxide nanosheets. For example, the electrical conductor may be a transparent conductive film.

The metal nanowire, i.e., the electrically conductive metal nanowire or conductive metal nanowire, included in the first conductive layer may comprise silver (Ag), copper (Cu), gold (Au), aluminum (Al), cobalt (Co), palladium (Pd), or a combination thereof (e.g., an alloy thereof or a nanometal wire having two or more segments). For example, the electrically conductive metal nanowire may include a silver nanowire.

The metal nanowire is electrically conductive. The metal nanowire may have an electrical conductivity equal to or greater than that of mercury, or equal to or greater than that of tin, or equal to or greater than that of copper. In an embodiment, the conductivity of the metal nanowire is about $1 \times 10^6$ Siemens per meter (S/m) to about $65 \times 10^6$ S/m, about $5 \times 10^6$ S/m to about $60 \times 10^6$ S/m, or about $10 \times 10^6$ S/m to about $45 \times 10^6$ S/m.

The electrically conductive metal nanowire may have an average diameter of less than or equal to about 50 nanometers (nm), for example less than or equal to about 40 nm, or less than or equal to about 30 nm, e.g., about 1 nm to about 50 nm, or about 2 nm to about 40 nm. The length of the electrically conductive metal nanowire is not particularly limited, and may be appropriately selected considering the diameter. For example, the electrically conductive metal nanowire may have a length of greater than or equal to about 1 micrometer (μm), greater than or equal to about 2 μm, greater than or equal to about 3 μm, greater than or equal to about 4 μm, or greater than or equal to about 5 μm, and is not limited thereto, and may have a length of about 1 μm to about 1000 μm, or about 2 μm to about 500 μm. According to another embodiment, the electrically conductive metal nanowire may have a length of greater than or equal to about 10 μm, for example greater than or equal to about 11 μm, greater than or equal to about 12 μm, greater than or equal to about 13 μm, greater than or equal to about 14 μm, or greater than or equal to about 15 μm, and may have a length of about 10 μm to about 10,000 μm, or about 20 μm to about 5000 μm. The electrically conductive metal nanowire may be fabricated according to any suitable method and may be a suitable commercially available metal nanowire. The nanowire may comprise a polymeric coating, such as a coating including polyvinylpyrrolidone, on a surface thereof.

A second conductive layer including a plurality of two-dimensional metal oxide nanosheets is provided on a surface (e.g., a bottom surface) of the first conductive layer. The first conductive layer and the second conductive layer may contact each other. The metal oxide nanosheets may comprise a transition metal oxide. The metal oxide nanosheets may comprise $Ti_xO_2$ wherein x is 0.8 to 1, $Ti_3O_7$, $Ti_4O_9$, $Ti_5O_{11}$, $Ti_{1-x}Co_xO_2$ wherein 0<x≤0.2, $Ti_{1-x}Fe_xO_2$ wherein 0<x≤0.4, $Ti_{1-x}Mn_xO_2$ wherein 0<x≤0.4, $Ti_{0.8-x/4}Fe_{x/2}Co_{0.2-x/4}O_2$ wherein x is 0.2 to 0.6, or 0.2, 0.4, or 0.6, $MnO_2$, $Mn_3O_7$, $Mn_{1-x}Co_xO_2$ wherein 0<x≤0.4, $Mn_{1-x}Fe_xO_2$ wherein 0<x≤0.2, $TiNbO_5$, $Ti_2NbO_7$, $TiTaO_5$, $Nb_3O_8$, $Nb_6O_{17}$, $TaO_3$, $LaNb_2O_7$, $La_{0.90}Eu_{0.05}Nb_2O_7$, $Eu_{0.56}Ta_2O_7$, $SrTa_2O_7$, $Bi_2SrTa_2O_9$, $Ca_2Nb_3O_{10}$, $Sr_2Nb_3O_{10}$, $NaCaTa_3O_{10}$, $CaLaNb_2TiO_{10}$, $La_2Ti_2NbO_{10}$, $Ba_5Ta_4O_{15}$, $W_2O_7$, $RuO_{2+x}$ wherein 0≤x≤0.5, $Cs_4W_{11}O_{36}$, or a combination thereof.

For example, the metal oxide nanosheet may include $RuO_{2+x}$ wherein 0≤x≤0.5 for example, 0≤x≤0.1 (hereinafter, ruthenium oxide), $Ti_xO_2$ wherein x is 0.8 to 1 (hereinafter, titanium oxide), or a combination thereof.

The metal oxide nanosheet may be prepared by any suitable method and may be a suitable commercially available metal oxide nanosheet.

In some embodiments, nanosheets of the titanium oxide or the ruthenium oxide may be prepared from an alkali metal titanium oxide (e.g., an alkali metal titanium oxide of the formula $MTiO_2$ wherein M is Na, K, Rb, or Cs) or an alkali metal ruthenium oxide (e.g., an alkaline metal ruthenium oxide of the formula $MRuO_2$ wherein M is Na, K, Rb, or Cs, which have a layered structure (for example a structure of the form $M-RuO_2-M-RuO_2-M$ for the alkali metal ruthenium oxide). The alkali metal titanium oxide and the alkali metal ruthenium oxide may be obtained by mixing an alkali metal compound with titanium oxide or ruthenium oxide and calcining or melting the obtained mixture at an appropriate temperature, for example about 500° C. to about 1000° C. When the obtained alkali metal titanium oxide or alkali metal ruthenium oxide is treated with an acid solution, at least a portion of the alkali metal is proton-exchanged to provide a proton-type alkali metal titanate hydrate or a proton-type alkali metal ruthenate hydrate. The obtained proton-type alkali metal titanate hydrate or the obtained proton-type alkali metal ruthenate hydrate may react with a C1 to C20 alkylammonium or a C1 to C20 alkylamine to provide a C1 to C20 alkylammonium- or a C1 to C20 alkylamine-substituted compound, which is then mixed with a solvent to be exfoliated into nanosheets, thereby producing titanium oxide nanosheets or ruthenium oxide nanosheets. The solvent may be a high dielectric constant solvent. For example, the solvent may comprise water, alcohol, acetonitrile, dimethyl sulfoxide, dimethyl formamide, propylene carbonate, or a combination thereof.

For example, during the protonation of $Na_aRuO_{2+x}$ wherein x is 0 to about 0.5 and a is about 0.1 to about 1), $Na_aRuO_{2+x}$ and an acid compound (e.g., HCl) are reacted, and thereby $Na^+$ is substituted with $H^+$ so that protonized layered ruthenium oxide (e.g., $H_aRuO_{2+x}$) is obtained. Subsequently, during the exfoliation, the obtained $H_aRuO_{2+x}$ is reacted with an alkyl ammonium salt (e.g., hydroxide, bromide, chloride, and the like) intercalant (e.g., tetraalkyl ammonium hydroxide, tetraalkyl ammonium bromide, tetraalkyl ammonium chloride, and the like), so that $H^+$ is substituted with an alkyl ammonium cation (e.g., tetrabutylammonium cation, $TBA^+$). The alkyl ammonium salt may be a C1 to C16 alkyl ammonium salt. While not wanting to be bound by theory, it is understood that the intercalant molecule (e.g., $TBA^+OH$) has such a large size that when it is interposed between the $RuO_2$ layers an interlayer distance between the layers is increased, causing interlayer separation. Thus, adding the same into a solvent and agitating cause exfoliation to provide $RuO_{2+x}$ nanosheets. The exfoliated metal oxide nanosheets are dispersed in the solvent to form a colloidal solution having a certain concentration. The agitating may include an ultrasonication treatment. For example, the agitation is carried out for a predetermined time with respect to the obtained $H_aRuO_{2+x}$ in a solution including the intercalant to insert the intercalant thereinto and then the ultrasonication treatment may be carried out. The ultrasonic power may be greater than or equal to about 20 W, for example, greater than or equal to about 40 W, or greater than or equal to about 60 W, The ultrasonic power may be less than or equal to about 400 W, for example, less than or equal to about 300 W, less than or equal to about 200 W, or less than or equal to about 100 W. The equipment for the ultrasonication treatment may be any known device or any commercially available one.

The time for the agitation is not particularly limited and may be selected appropriately. For example, the agitation time may be greater than or equal to about 10 minutes, for example, greater than or equal to about 30 minutes, greater than or equal to about 1 hour. The agitation time may greater than or equal to about 1 day, for example, greater than or equal to about 2 days, or even greater than or equal to about 3 days. The ultrasonication treatment may reduce the agitation time. The ultrasonication treatment time may be greater than or equal to about 1 minute, for example, greater than or equal to about 5 minutes. The ultrasonication treatment time may be less than or equal to about 300 minutes, for example, less than or equal to about 100 minutes, less than or equal to about 90 minutes, less than or equal to about 80 minutes, less than or equal to about 70 minutes, or less than or equal to about 60 minutes.

The nanosheets prepared by using the ultrasonication may show a relatively low value of standard deviation in their lateral size. In some embodiments, the oxide nanosheets may have a standard deviation of less than or equal to about 2.0 um, for example, less than or equal to about 1.5 um, less than or equal to about 1 um, less than or equal to about 0.9 um, less than or equal to about 0.8 um, less than or equal to about 0.7 um, less than or equal to about 0.6 um, less than or equal to about 0.5 um in their lateral sizes.

When the preparation of the metal oxide nanosheets involves the ultrasonication, the concentration of the resulting colloidal solution may be relatively easily controlled in comparison with the case that uses a simple agitation. In some embodiments, the concentration of the nanosheets in the colloidal solution may be about 1 g/L to about 1/7 g/L, for example, about 1.3 g/L to about 1.6 g/L. In another embodiment, the exfoliation of the alkali metal titanium oxide or the alkali metal ruthenium oxide may be carried out using at least two types of intercalant compounds having different sizes. For example, the at least two types of intercalant compounds having different sizes may comprise at least two different sized compounds, each having a functional group different from each other. The solution of the intercalant for exfoliation may include the aforementioned intercalants at a concentration of about 0.01 mole percent (mol %) to about 20 mol %, about 0.1 mol % to about 10 mol %, or about 0.5 mol % to about 5 mol %, with respect to the cation of the protonated metal oxide type layered material. The exfoliation using the at least two intercalants may produce a titanium oxide nanosheet or a ruthenium oxide nanosheet having the at least two intercalants on a surface thereof. The metal oxide nanosheets prepared by the exfoliation using the at least two intercalants may exhibit further enhanced electrical conductivity and further improved light transmittance.

Without wishing to be bound by any theory, in the intercalant-based exfoliation, using only one type of intercalant of a certain size may not produce a uniformly exfoliated monolayer. For example, when a single intercalant compound such as tetrabutylammonium hydroxide (TBAOH) or tetramethylammonium hydroxide (TMAOH) is used, the protonated metal oxide may be exfoliated not into a single layer but into a sheet having at least two layers, and thus the thickness of the resulting nanosheets lacks uniformity and the nanosheets may have an average thickness of about 3 nm to about 4 nm.

Figure 2:
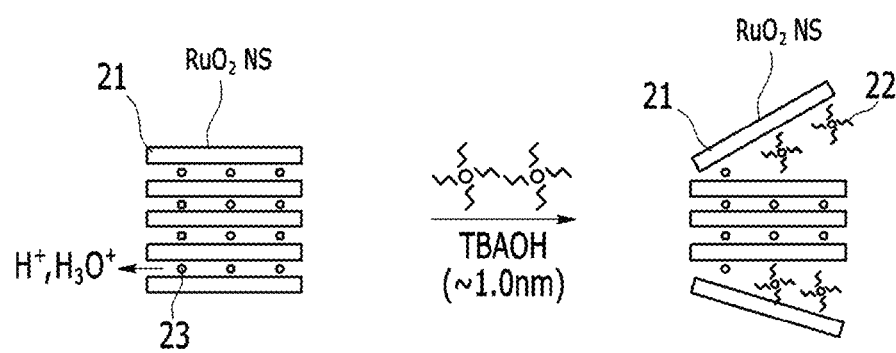
FIG. 2 is a schematic illustration of an exfoliation process using a single intercalant.

When an intercalant having a large molecular size (e.g., TBAOH) is used, it is difficult to obtain exfoliated nanosheets having a uniform and suitably thin thickness. FIG. 2 illustrates an embodiment of a process to exfoliate a $RuO_{2+x}$ nanosheet 21 (which may be abbreviated as "$RuO_2$" NS) using TBAOH by ion exchange of $H^+$ (or $H_3O^+$) 23 with tetrabutylammonium 22. Referring to FIG. 2, the molecular size of the TBAOH is about 1 nm and the distance between the layers of the protonated metal oxide (e.g., $H_aRuO_{2+x}$) is less than about 1 nm. Therefore, it may be difficult for the intercalant (e.g., TBAOH) to be uniformly inserted between the layers, and thus no exfoliation may occur for the layers between which the TBAOH does not enter. On the other hand, when an intercalant having a small molecular size (e.g., TMAOH) is used, exfoliation may not occur and thus nanosheets may not be provided. In order for the exfoliation to occur, the distance between the layers may have to be greater than or equal to about 1 nm. However, even when the TMAOH is inserted between the layers of $H_aRuO_{2+x}$, it may be difficult to increase the distance between the layers to over about 1 nm.

Figure 3:
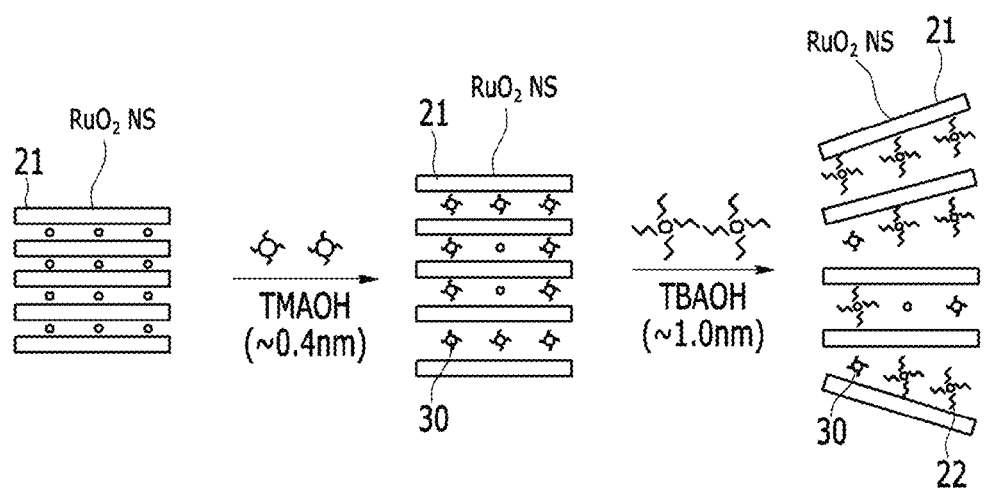
FIG. 3 is a schematic illustration of an exfoliation process using two different types of intercalants.

For some applications, such as transparent conductors, it may be desirable for the exfoliated nanosheets of the metal oxide layered material to have an average thickness of greater than or equal to about 1 nm (e.g., greater than about 1 nm) and less than or equal to about 2 nm. Unlike the exfoliation using a single intercalant, the exfoliation using the at least two intercalants having different sizes may produce the nanosheets having an average thickness of the aforementioned range. For example, referring to FIG. 3, TMAOH and TBAOH may be used as a small intercalant (i.e., a first intercalant) and a large intercalant (i.e., a second intercalant), respectively, to exfoliate the protonated ruthenium oxide ($H_aRuO_{2+x}$) by exchange of $H^+$ (or $H_3O^+$) with tetrabutylammonium 22 and tetramethylammonium 30.

TMAOH has a size (e.g., a diameter) of about 0.4 nm and thus may be easily inserted between the layers of the layered $H_aRuO_{2+x}$, and such insertion may increase the distance between the layers of the layered $H_aRuO_{2+x}$. Then, TBAOH may be easily inserted between the layers having the increased interlayer distance by the TMAOH to further broaden the distance between the layers, and thereby exfoliation may occur to produce metal oxide nanosheets having a desired average thickness. The resulting metal oxide nanosheets may be included in the second conductive layer of the electrical conductor according to an embodiment to contribute improvement of the electrical and optical properties of the conductor.

The at least two intercalant compounds having different sizes may comprise a tetramethylammonium compound (e.g., tetramethylammonium hydroxide), a tetraethylammonium compound (e.g., tetraethylammonium hydroxide), a tetrapropylammonium compound (e.g., tetrapropylammonium hydroxide), a benzyl trialkyl ammonium compound (e.g., benzyltrimethylammonium hydroxide), a tetrabutylammonium compound (e.g., tetrabutylammonium hydroxide), or a combination thereof.

In some embodiments, the protonated metal oxide may be treated with a first intercalant having a small size and a second intercalant having a large size, but the treatment is not limited thereto. Examples of the first intercalant having a small size may include tetramethylammonium hydroxide, tetraethylammonium hydroxide, or a combination thereof. Examples of the second intercalant having a large size may include tetrabutylammonium hydroxide, benzyltrimethylammonium hydroxide, or a combination thereof.

The metal oxide nanosheets may have an average lateral size, e.g., a length or width dimension in an in-plane direction, of greater than or equal to about 0.05 μm, for example greater than or equal to about 0.1 μm, greater than or equal to about 0.4 μm, greater than or equal to about 0.5 μm, greater than or equal to about 1 μm, greater than or equal to about 2 μm, greater than or equal to about 3 um, greater than or equal to about 4 μm, greater than or equal to about 5 μm, or greater than or equal to about 6 μm. The metal oxide nanosheets may have an average lateral size of less than or equal to about 100 μm, for example less than or equal to about 30 μm, less than or equal to about 20 μm, less than or equal to about 10 μm, less than or equal to about 9 μm, less than or equal to about 8 μm, or less than or equal to about 7 μm. The average lateral size of the nanosheets may be determined in a Scanning Electron Microscopy analysis wherein a predetermined number (e.g., about 100) of nanosheets are randomly selected and for each of the selected nanosheets, the largest value of a length or width dimension is measured and an average of the measured values is calculated. The metal oxide nanosheets may have a standard deviation of less than or equal to about 2 μm in their lateral size. The metal oxide nanosheets may have a standard deviation of less than or equal to about 0.5 μm in the lateral size. In some embodiments, as the standard deviation decreases, resulting conductors prepared from the nanosheets may show more homogeneous properties (e.g., electrical properties).

In an embodiment, metal oxide nanosheets may have a lateral size of about 0.5 μm to about 100 μm, or about 1 μm to about 50 μm, or about 2 μm to about 25 μm, and an average lateral size of the metal oxide nanosheets may be about 0.5 μm to about 100 μm, or about 1 μm to about 50 μm, or about 2 μm to about 25 μm.

The metal oxide nanosheets may have an average thickness of less than or equal to about 3 nm, for example less than or equal to about 2.5 nm, or less than or equal to about 2 nm. The metal oxide nanosheets may have an average thickness of greater than or equal to about 1 nm, for example greater than about 1 nm. In an embodiment, metal oxide nanosheets may have a thickness of about 1 nm to about 3 nm, or about 1.2 nm to about 2.8 nm, or about 1.5 nm to about 2.5 nm, and an average thickness of the metal oxide nanosheets may be about 1 nm to about 3 nm, or about 1.2 nm to about 2.8 nm, or about 1.5 nm to about 2.5 nm. When the nanosheets have a size of greater than or equal to about 1 μm, the contact resistance between nanosheets may be minimized to decrease the sheet resistance of the transparent electrode comprising the metal oxide nanosheets. When the average thickness of the metal oxide nanosheets is between 1 nm and about 3 nm, the transmittance may be increased, and the transmittance of the transparent electrode may be improved.

The metal oxide nanosheets exfoliated by the aforementioned intercalation may have improved conductivity and improved light transmittance, and may also contribute to a flexibility of the obtained electrical conductor, and thus it may be advantageously applied to provide an electrical conductor having improved flexibility, for example a flexible transparent conductive layer or the like. For example, the second conductive layer including the aforementioned metal oxide nanosheets may be disposed on a surface of the first conductive layer to form an electrical conductor according to the embodiment.

The second conductive layer including the metal oxide nanosheets may include a discontinuous layer including an open space between the metal oxide nanosheets, and the area ratio of the open space to the total area of the second conductive layer may be less than or equal to about 50%, for example less than or equal to about 40%, less than or equal to about 30%, less than or equal to about 20%, or less than or equal to about 10%, or about 1% to about 50%, or about 2% to about 40%. For example, a Scanning Electron Microscopic image of the first conductive layer including nanosheets disposed to have an open space is obtained and the area of the open space (i.e., the portion not having the nanosheets in the first conductive layer) is determined and is divided with the total area of the first conductive layer to provide an area ratio. In the electrical conductor, a conductive metal nanowire may extend over the open space of the second conductive layer.

The electrical conductor having the aforementioned structure may have significantly improved conductivity and high light transmittance and may be provided enhanced flexibility. The electrical conductor may have transmittance of greater than or equal to about 85%, for example greater than or equal to about 88%, greater than or equal to about 89%, greater than or equal to about 90%, or even greater than or equal to about 95%, or about 85% to about 99.9%, or 90% to about 99%, with respect to light having a wavelength of 550 nm (or with respect to visible light, for example having a wavelength of 400 nm to 700 nm) at a thickness (for example, of the first and/or the second conductive layers) of less than or equal to about 100 nm (e.g., less than or equal to about 90 nm, less than or equal to about 80 nm, less than or equal to about 70 nm, less than or equal to about 60 nm, or less than or equal to about 50 nm), and its sheet resistance may be less than about 100 ohms pre square (Ω/sq), for example, less than or equal to about 90 Ω/sq, less than or equal to about 80 Ω/sq, less than or equal to about 70 Ω/sq, less than or equal to about 60 Ω/sq, less than or equal to about 50 Ω/sq, less than or equal to about 40 Ω/sq, less than or equal to about 39 Ω/sq, less than or equal to about 38 Ω/sq, less than or equal to about 37 Ω/sq, less than or equal to about 36 Ω/sq, or less than or equal to about 35 Ω/sq, or about 1 Ω/sq to about 100 Ω/sq, or about 2 Ω/sq to about 90 Ω/sq.

Figure 4:
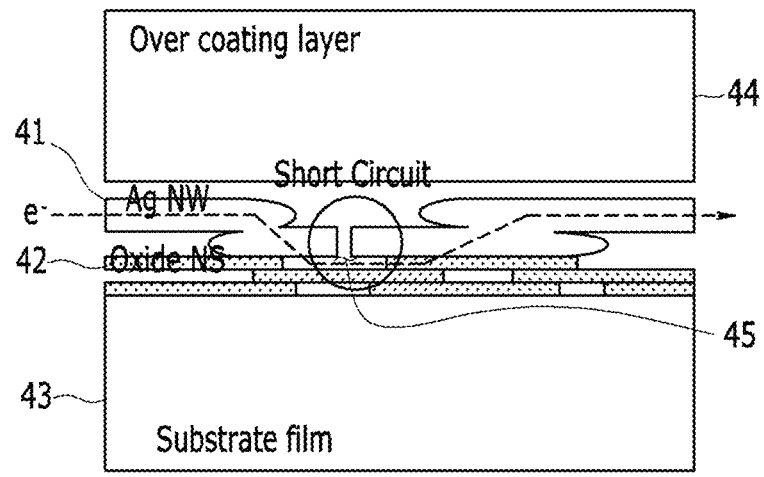
FIG. 4 is a schematic illustration of a conductor according to another embodiment.

Without wishing to be bound by any theory, the one-dimensional conductive metal nanowires and the two-dimensional metal oxide nanosheets form such a hybrid structure in which the metal oxide nanosheet may provide electrical conduction for a break of the conduction path formed by the metal nanowire (for example, when the resulting conductor is folded), as shown schematically in FIG. 4, which illustrates an embodiment in which Ag nanowires (Ag NW) 41 and metal oxide nanosheets (Oxide NS) 42 are disposed between a substrate 43 and an over coating layer 44. As shown in FIG. 4, conductivity is maintained by the metal oxide nanosheets when a break 45 occurs in the nanowires.

Formation of the first conductive layer and the second conductive layer may be carried out by any suitable method of forming a layer, and is not particularly limited.

In some embodiments, the second conductive layer including the metal oxide nanosheets is formed on a substrate and the first conductive layer including the metal nanowires is formed on a surface of the second conductive layer. In this case, the substrate may be disposed on a surface of the second conductive layer opposing to the first conductive layer.

The substrate may be a transparent substrate. The substrate may be a metal substrate. A material of the substrate is not particularly limited, and it may be a glass substrate, a semiconductor substrate like Si, a polymer substrate, or a combination thereof, or may be a substrate laminated with an insulation layer and/or a conductive layer. For non-limiting examples, the substrate may comprise an inorganic material such as an oxide glass or a glass, a polyester such as polyethylene terephthalate, polybutylene terephthalate, or polyethylene naphthalate, polycarbonate, an acryl-based resin, a cellulose or a derivative thereof, a polymer such as a polyimide, or organic/inorganic hybrid material, or a combination thereof. The thickness of the substrate is also not particularly limited, but may be appropriately selected according to the kind of final product. For example, the substrate may have a thickness of greater than or equal to about 0.5 μm, for example greater than or equal to about 1 μm, or greater than or equal to about 10 μm, but is not limited thereto. The thickness of the substrate may be less than or equal to about 1 mm, for example less than or equal to about 500 μm, or less than or equal to about 200 μm, but is not limited thereto. An additional layer (e.g., an undercoat) may be provided between the substrate and the conductive layer, if desired (e.g., for controlling a refractive index).

The second conductive layer or the first conductive layer may be formed by applying an appropriate coating composition (including the nanosheets or the nanowires) on a substrate or a second conductive layer, respectively, and removing the solvent. The coating composition may further include an appropriate solvent (e.g., water, an organic solvent miscible with water or immiscible with water, or the like), a binder, and a dispersing agent (e.g., hydroxypropyl methylcellulose (HPMC)).

For example, an ink composition including the metal nanowires is commercially available or may be prepared in any suitable method. For example, the ink may have the composition set forth in Table 1.

TABLE 1

| | Material | Amount* |
|---|---|---|
| Conductive metal | Conductive metal (e.g. Ag) nanowire aqueous solution (conc.: about 0.001 to about 10.0 wt %) | 5~40 wt % |
| Solvent | Water | 20~70 wt % |
| | Alcohol (ethanol) | 10~40 wt % |

TABLE 1-continued

| | Material | Amount* |
|---|---|---|
| Dispersing agent | Hydroxypropyl methyl cellulose aqueous solution (conc.: about 0.05 to about 5 wt %) | 1~10 wt % |

*wt % is weight percent

For example, the composition including metal oxide nanosheets may include the components in Table 2.

TABLE 2

| | Material | Amount* |
|---|---|---|
| Conductive material | $RuO_2$ aqueous solution (concentration: 0.001-10.0 g/L) | 30-70 wt % |
| Solvent | Water | 10-50 wt % |
| | Isopropanol | 1-20 wt % |
| Dispersing agent | Hydroxypropyl methylcellulose aqueous solution (conc.: about 0.05 wt % to about 5 wt %) | 5-30 wt % |

When the concentration of the nanosheet aqueous solution is greater than about 0.001 gram per liter (g/L), a transparent conductor may be prepared to have a desired electrical conductivity by including a sufficient number of $RuO_{2+x}$ nanosheets. When the concentration of the nanosheet aqueous solution is less than about 10.00 g/L, a transparent and flexible conductor may be prepared without any substantial loss of transparency or flexibility. In addition, in order to increase a dispersibility of $RuO_{2+x}$ nanosheets, the $RuO_{2+x}$ nanosheet solution may include a dispersing agent, such as a hydroxypropyl methyl cellulose (HPMC) aqueous solution. The concentration of the HPMC aqueous solution may be from about 0.05 weight percent (wt %) to about 5 wt %. Within such ranges, it is possible to maintain the dispersibility of the $RuO_{2+x}$ nanosheets without causing any adverse effects by the organic substances, for example, a decrease in electrical conductivity or a decrease in transmittance.

The composition may be applied onto a substrate (or optionally, on the first or second conductive layer), and then may be dried and/or heat-treated if desired to produce the conductive layer. The coating of the composition may be performed by various methods, for example bar coating, blade coating, slot die coating, spray coating, spin coating, gravure coating, inkjet printing, or a combination thereof. The nanosheets may contact each other for providing an electrical connection. When the prepared nanosheets are physically connected to provide as thin a layer as possible, it may provide further improved transmittance.

The first conductive layer and/or the second conductive layer may include an organic binder for binding the nanowires and/or the nanosheets. The binder may play a role of appropriately adjusting viscosity of the composition for a conductive layer or enhancing adherence of nanosheets on the substrate. Examples of the binder may include, but are not limited to, methyl cellulose, ethyl cellulose, hydroxypropyl methyl cellulose (HPMC), hydroxypropyl cellulose (HPC), xanthan gum, polyvinyl alcohol (PVA), polyvinylpyrrolidone (PVP), carboxylmethyl cellulose, hydroxyethyl cellulose, or a combination thereof. An amount of binder may be appropriately selected, and is not particularly limited. In non-limiting examples, an amount of the binder may be about 1 to about 100 parts by weight, based on 100 parts by weight of the nanosheets (or the nanowires).

The electrical conductor may further include an overcoating layer (OCL) including a thermosetting resin, an ultraviolet (UV)-curable resin, or a combination thereof, on at least one of the first conductive layer and the second conductive layer. Examples of the thermosetting resin and the ultraviolet (UV)-curable resin for the OCL are known in the art. A method of forming an OCL from the aforementioned materials on the conductive layer is also known and is not particularly limited.

The electrical conductor may exhibit enhanced flexibility. For example, after being folded, the electrical conductor may have a resistance change that is significantly lower than that of the electrical conductor including the nanowires only. In some embodiments, the electrical conductors may have a resistance change of less than or equal to about 60%, for example, less than or equal to about 50%, less than or equal to about 40%, or less than or equal to about 30% when it is folded 200,000 times to have a curvature radius of 1 millimeter (mm) (1R).

In another embodiment, a one-dimensional (1 D)/a two-dimensional (2D) hybrid structure has a nanosheet layer including a plurality of metal oxide nanosheets and a nanowire layer disposed on the nanosheet layer and including a plurality of metal nanowires. In the nanowire layer, a conductive metal nanowire of the plurality of metal nanowires contacts at least two metal oxide nanosheets of the plurality of metal oxide nanosheets, and the plurality of metal oxide nanosheets in the nanosheet layer include an electrical connection between contacting metal oxide nanosheets. Details of the nanosheets layer are the same as set forth regarding the second conductive layer. Details of the nanowire layer are the same as set forth regarding the first conductive layer. The aforementioned 1D/2D hybrid structure may be prepared in the same manner as set forth regarding the aforementioned electrical conductor.

In another embodiment, an electronic device includes the electrical conductor or the hybrid structure.

The electronic device may be a flat panel display, a touch screen panel, a solar cell, an e-window, an electrochromic mirror, a heat mirror, a transparent transistor, or a flexible display.

Figure 16:
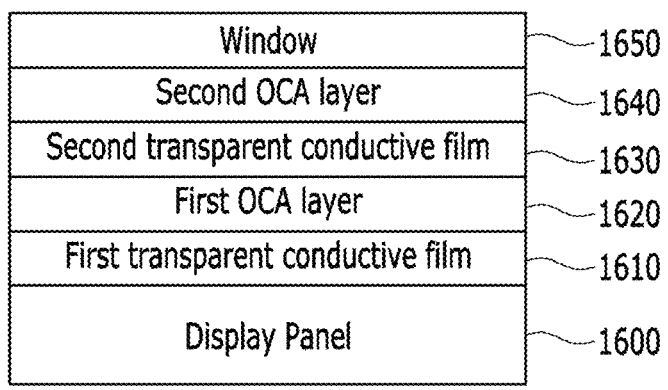
FIG. 16 is a schematic cross-sectional view of an electronic device according to an embodiment.

In an exemplary embodiment, the electronic device may be a touch screen panel (TSP). The detailed structure of the touch screen panel can be determined by one of skill in the art without undue experimentation. The schematic structure of the touch screen panel is shown in FIG. 16. Referring to FIG. 16, the touch screen panel may include a first transparent conductive film (or layer) 1610, a first transparent adhesive film (e.g., an optically clear adhesive (OCA)) film (or layer) 1620, a second transparent conductive film (or layer) 1630, a second transparent adhesive film (or layer) 1640, and a window 1650 for a display device, on a panel 1600 for a display device (e.g., an LCD panel). The first transparent conductive layer and/or the second transparent conductive layer may be the electrical conductor.

In addition, although an example of applying the conductor to a touch screen panel (e.g., a transparent electrode of TSP) is illustrated above, the conductor may be used as an electrode for other electronic devices including a transparent electrode without a particular limit. For example, the conductor may be applied as a pixel electrode and/or a common electrode for a liquid crystal display (LCD), an anode and/or a cathode for an organic light emitting diode device, or a display electrode for a plasma display device.

In some embodiments, the electrical conductor may be used as a heating element (e.g., may be included in the heating element) for example when the electrical conductor has the high resistance value. The electrical conductor may be heated up when there is a current flow therethrough because electrical energy may be transformed into thermal energy.

When be used as an electrode, the electrical conductor of the embodiments may be configured to have a sufficiently low resistance so that substantially no heat generates. When being used in the heating element, the electrical conductor of the embodiments may be configured to have a sufficiently high resistance so that the joule heating may occur. The level of the resistance may be adjusted by increasing/decreasing the number of the nanowires per a unit area and/or the average lateral size of the nanosheets. Hereinafter, an embodiment is illustrated in more detail with reference to examples. These examples, however, are not in any sense to be interpreted as limiting the scope of this disclosure.

EXAMPLES

Preparation Example 1-1: Preparation of Ruthenium Oxide Nanosheet via Exfoliation Using Two Types of Intercalants I $K_2CO_3$ and $RuO_2$ are mixed at a mole ratio of 5:8, and the mixture is pelletized. 4 grams (g) of the obtained pellet is introduced into an alumina crucible and heated in a tube furnace at 850° C. for 12 hours (h) under a nitrogen atmosphere. The total weight of the pellet may be changed within the range of 1 g to 100 g if desired. Then, the furnace is cooled to room temperature, and the treated pellet is taken out therefrom and ground to provide a fine powder.

The obtained fine powder is washed with 100 milliliters (mL) to 4 liters (L) of water for 24 h, and then filtered to provide a powder, the composition of which is $K_{0.2}RuO_{2.1} \cdot nH_2O$. The $K_{0.2}RuO_{2.1} \cdot nH_2O$ powder is then introduced into a 1 molar (M) HCl solution and agitated for 3 days (d) and then filtered to provide a powder, the composition of which is $H_{0.2}RuO_{2.1}$.

1 g of the obtained $H_{0.2}RuO_{2.1}$ powder is introduced into 250 mL of an aqueous solution of tetramethyl ammonium hydroxide (TMAOH) and tetrabutylammonium hydroxide (TBAOH), and agitated for greater than or equal to 10 d. In the aqueous solution, the concentrations of TMAOH and TBAOH are TMA+/H+=3 and TBA+/H+=3, respectively. After completing all processes, the final solution is centrifuged under the conditions of 2000 revolutions per minute (rpm) for 30 minutes (min) to obtain delaminated $RuO_{2.1}$ nanosheets.

Figure 5A:
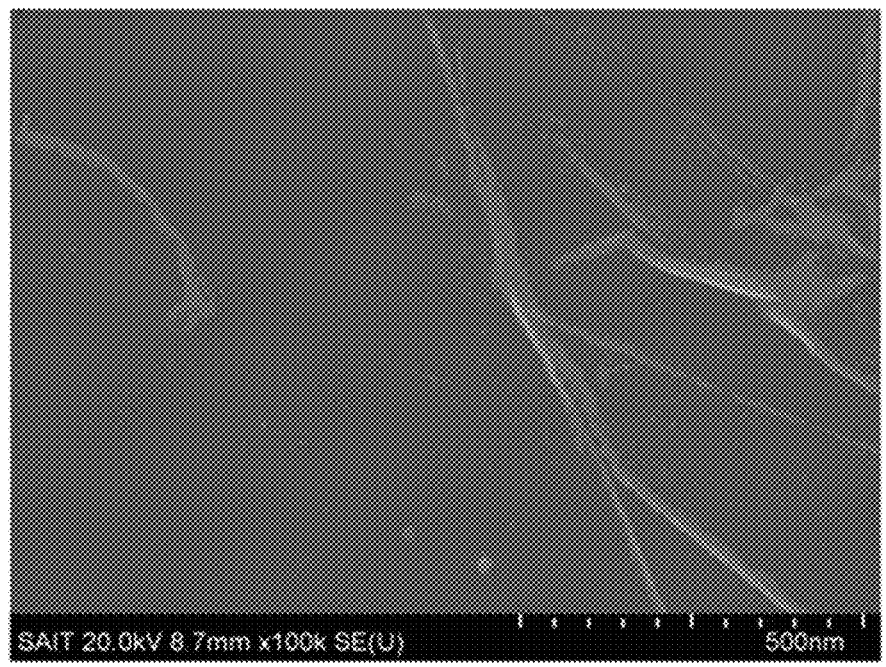
FIG. 5A is a scanning electron microscope image of a ruthenium oxide nanosheet of Preparation Example 1-1.
Figure 17:
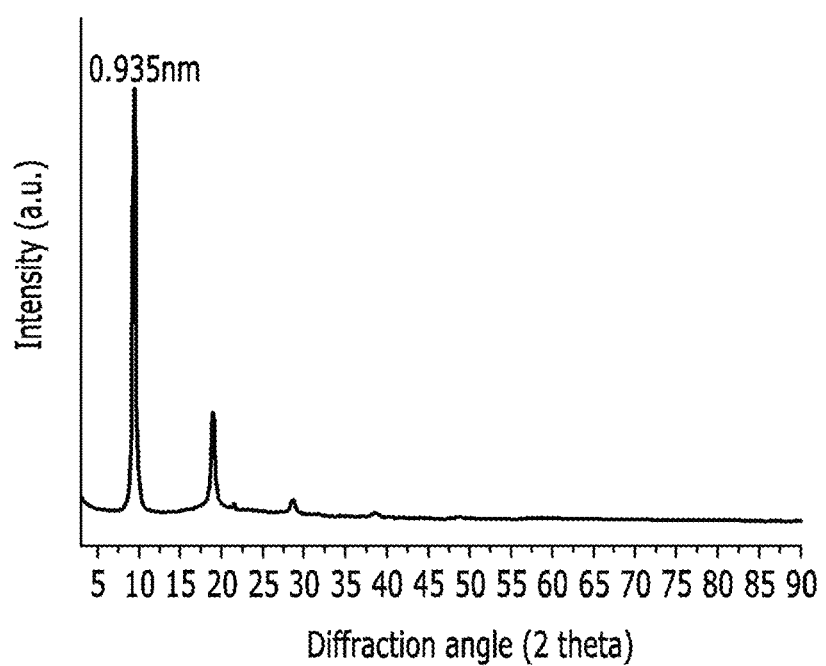
FIG. 17 is a graph of intensity (arbitrary units) versus diffraction angle ($2\theta$, degrees) which shows an X-ray diffraction spectrum of ruthenium oxide obtained from Preparation Example 1-1.

Results of Scanning Electron Microscopy (SEM) analysis are shown in FIG. 5A, which confirm that the average lateral size of the nanosheets is 6.96 μm. In the specification, the average lateral size may be determined as below: from the SEM images, about 100 nanosheets are randomly selected and sizes of them are measured. The average value of the lateral size and a standard deviation thereof are calculated from the measured sizes. The obtained nanosheets are subjected to X-ray diffraction (XRD) analysis, and the results thereof are shown in FIG. 17. From the results, the distance between the layers is 0.935 nm and this result may be affected by the presence of the TMAOH present between the layers.

Figure 5B:
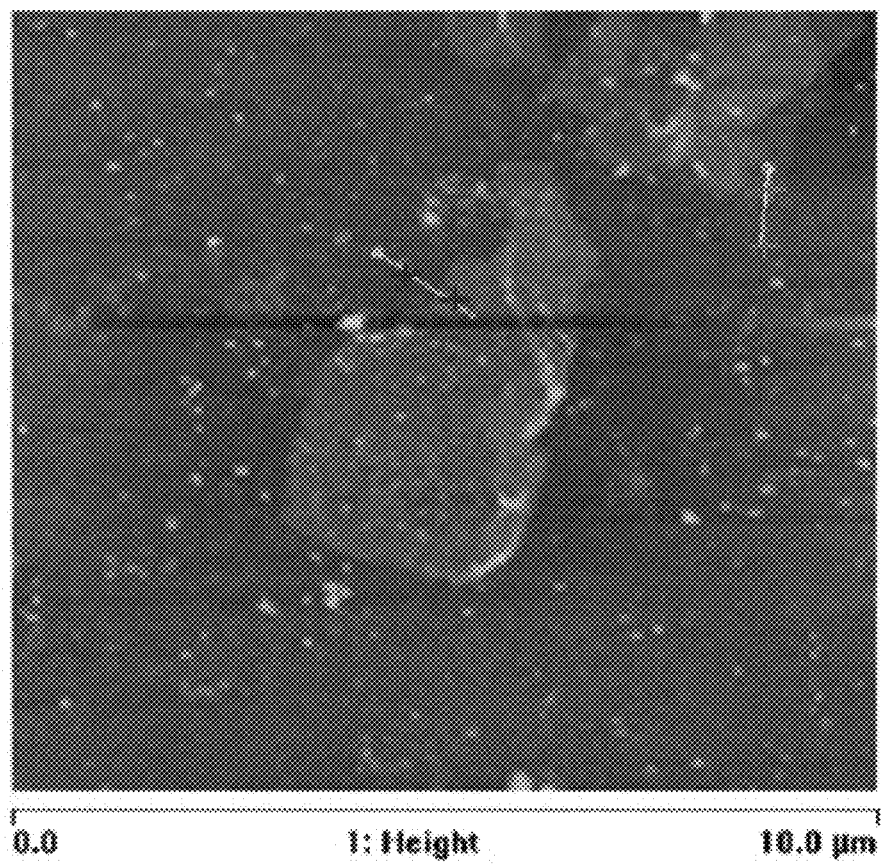
FIG. 5B is an atomic force microscope image of a ruthenium oxide nanosheet of Preparation Example 1-1.

An Atomic Force Microscope (AFM) is used to measure the thickness of the nanosheets, and the results are shown in FIG. 5B. The AFM may determine the height of the surface and the probe may measure the thickness of the nanosheets when it passes along the marked portion in FIG. 5B. In this manner, the thickness is measured for each of 20 nanosheets and the average thickness is determined to be 1.66 nanometers (nm).

Preparation Example 1-2: Preparation of Ruthenium Oxide Nanosheet via Exfoliation Using Two Types of Intercalants II The $RuO_{2.1}$ nanosheets are prepared in the same manner as set forth in Preparation Example 1-1 except that for exfoliation, 1 g of the obtained $H_{0.2}RuO_{2.1}$ powder is introduced into 250 mL of an aqueous solution of TMAOH and TBAOH (the concentrations of TMAOH and TBAOH are TMA+/H+=5 and TBA+/H+=5, respectively) and agitated for 10 d or longer.

The SEM analysis is conducted for the exfoliated $RuO_{2.1}$ nanosheets. Results of the SEM analysis confirm that the average lateral size of the nanosheets is 4.0 μm. An Atomic Force Microscope (AFM) is used to measure the thickness of the nanosheets, and the results confirm that the average thickness of the obtained nanosheets is about 1.23 nm.

Preparation Example 1-3: Preparation of Ruthenium Oxide Nanosheet via Exfoliation Using Two Types of Intercalants III The $RuO_{2.1}$ nanosheets are prepared in the same manner as set forth in Preparation Example 1-1 except that for exfoliation, 1 g of the obtained $H_{0.2}RuO_{2.1}$ powder is introduced into 250 mL of an aqueous solution of TMAOH and TBAOH (the concentrations of TMAOH and TBAOH are TMA+/H+=5 and TBA+/H+=5, respectively) and agitated for 3 days and then the resulting product is subjected to the ultrasonication for a predetermined time set forth in Table 3.

For the ultrasonication, a ultrasonic homogenisator (model name: UP400S Manufacturer: Hielscher) is used and the ultrasonic power is 80 W and the ultrasonication time is set for 1 minute to 60 minutes. The results are shown in Table 3:

The results are shown in Table 3:

TABLE 3

| Ultrasonication time (min) | Average lateral size of the nanosheet and a standard deviation thereof (μm) | Nanosheet concentration of the colloidal solution (g/L) |
| --- | --- | --- |
| 0 | 2.32 ± 1.81 | 0.88 |
| 1 | 2.07 ± 1.34 | 1.59 |
| 3 | 1.60 ± 1.07 | 1.84 |
| 7 | 1.36 ± 0.76 | 1.96 |
| 15 | 1.01 ± 0.80 | 2.11 |
| 30 | 0.69 ± 0.43 | 2.11 |
| 60 | 0.48 ± 0.24 | 2.13 |

The results of Table 3 confirm that the average lateral size of the nanosheets decreases by about 10% and the concentration of the nanosheets increases to 1.8 times when the ultrasonication is conducted for about 1 minute. In addition, when the ultrasonication is conducted for about 60 minutes, the average lateral size of the nanosheets is about 0.48 um. In addition, the ultrasonication may result in a decrease in the standard deviation of the distribution of the lateral sizes of the nanosheets.

Figure 21:
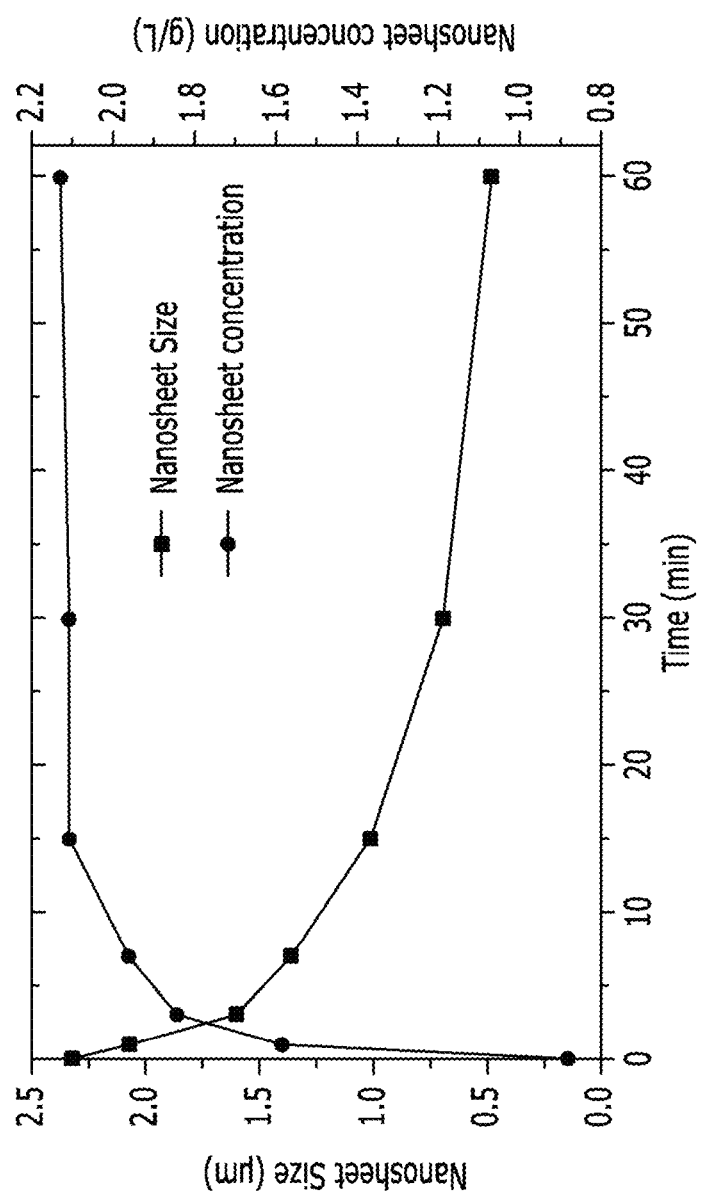
FIG. 21 is a graph of the ruthenium oxide nanosheet size or the ruthenium oxide nanosheet concentration versus the ultrasonic treatment time as conducted in Preparation Example 1-3.

A graph of the average lateral size of the nanosheets versus the ultrasonication time and a graph of the concentration of the nanosheets (monolayer) in the colloidal solution versus the ultrasonication time are shown in FIG. 21. In Preparation Example 1-1, when the $H_{0.2}RuO_{2.1}$ powder is introduced into the intercalant aqueous solution and agitated for 14 days, the concentration of the (monolayer) nanosheets in the resulting colloidal solution is about 1.5 g/L on average. However, in this preparation Example, when the $H_{0.2}RuO_{2.1}$ powder is introduced into the intercalant aqueous solution, agitated for 3 days, and then is subjected to ultrasofication for one minute, the concentration is about 1.59 g/L, which is similar to that of the sample obtained after the 14 day agitation.

Preparation Example 2

Synthesis of Titanium Oxide Nanosheet via Exfoliation Using Two Types of Intercalants $K_2O_3$, $TiO_2$, $Li_2CO_3$, and $MoO_3$ are mixed at a mole ratio of 1.67:1.73:0.13:1.27, and the mixture is pelletized. 4 g of the obtained pellet is introduced into an alumina crucible and heated in a tube furnace at 1200° C. for 10 h under a nitrogen atmosphere. The total weight of the pellet may be changed within the range of 1 g to 100 g if desired. Then, the furnace is cooled to about 900° C. at a rate of 4 degrees kelvin per hour (K/h) and then is naturally cooled from 900° C. to room temperature, and the treated pellet is taken out therefrom and ground to provide a fine powder.

The obtained fine powder is washed with 100 mL to 4 L of water, and then filtered to provide a powder, the composition of which is $K_{0.8}[Ti_{1.73}Li_{0.27}]O_4$. The $K_{0.8}[Ti_{1.73}Li_{0.27}]O_4$ powder is then introduced into a 0.5 M HCl solution and agitated for 5 d and then filtered to provide a powder, the composition of which is $H_{1.07}Ti_{1.73}O_4H_2O$.

1 g of the obtained $H_{1.07}Ti_{1.73}O_4H_2O$ powder is introduced into 250 mL of an aqueous solution of tetramethyl ammonium hydroxide (TMAOH) and tetrabutylammonium hydroxide (TBAOH), and agitated for greater than or equal to 10 d. In the aqueous solution, the concentrations of TMAOH and TBAOH are TMA+/H+=2 and TBA+/H+=2, respectively. After completing all processes, the final solution is centrifuged under the conditions of 2000 rpm and 30 min to obtain delaminated $TiO_{2+x}$ (wherein, x is 0 to 0.5) nanosheets.

Figure 18:
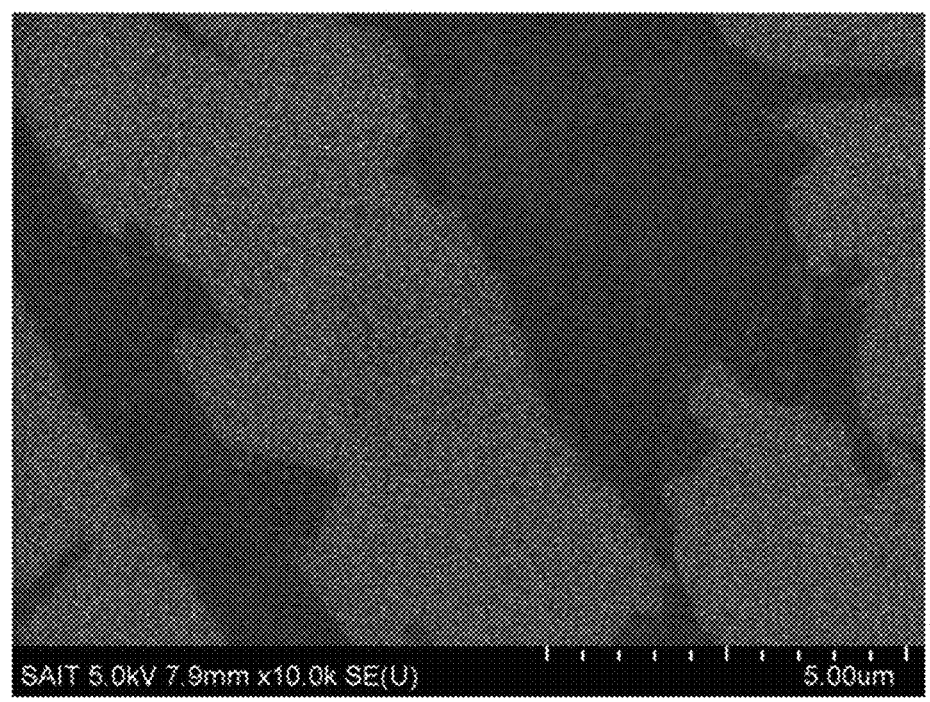
FIG. 18 is a scanning electron microscope image of the titanium oxide nanosheet layer (i.e., a second conductive layer) prepared in Preparation Example 2.

Results of Scanning Electron Microscopy (SEM) analysis are shown in FIG. 18, which confirms that the average lateral size of the nanosheets is 13.09 μm.

Preparation Example 3

Synthesis of Ruthenium Oxide Nanosheet via Exfoliation Using a Single Intercalant The ruthenium oxide nanosheets are prepared in the same manner as set forth in Preparation Example 1-1 except that for exfoliation, the obtained $H_{0.2}RuO_{2.1}$ powder is introduced into 250 mL of an aqueous solution of tetrabutylammonium hydroxide (the concentration of TBAOH is TBA+/H+=3) and agitated for 10 d or longer.

Figure 6A:
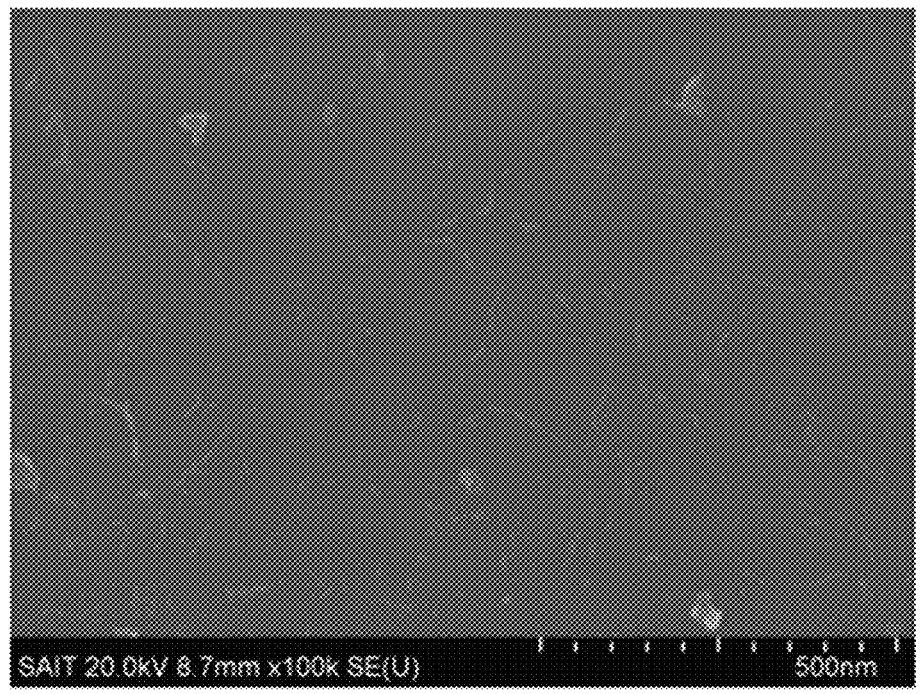
FIG. 6A is a scanning electron microscope image of a ruthenium oxide nanosheet of Preparation Example 3.

Results of Scanning Electron Microscopy (SEM) analysis are shown in FIG. 6A, which confirms that the average lateral size of the nanosheets is 0.47 μm (with a standard deviation of 0.22 μm).

Figure 6B:
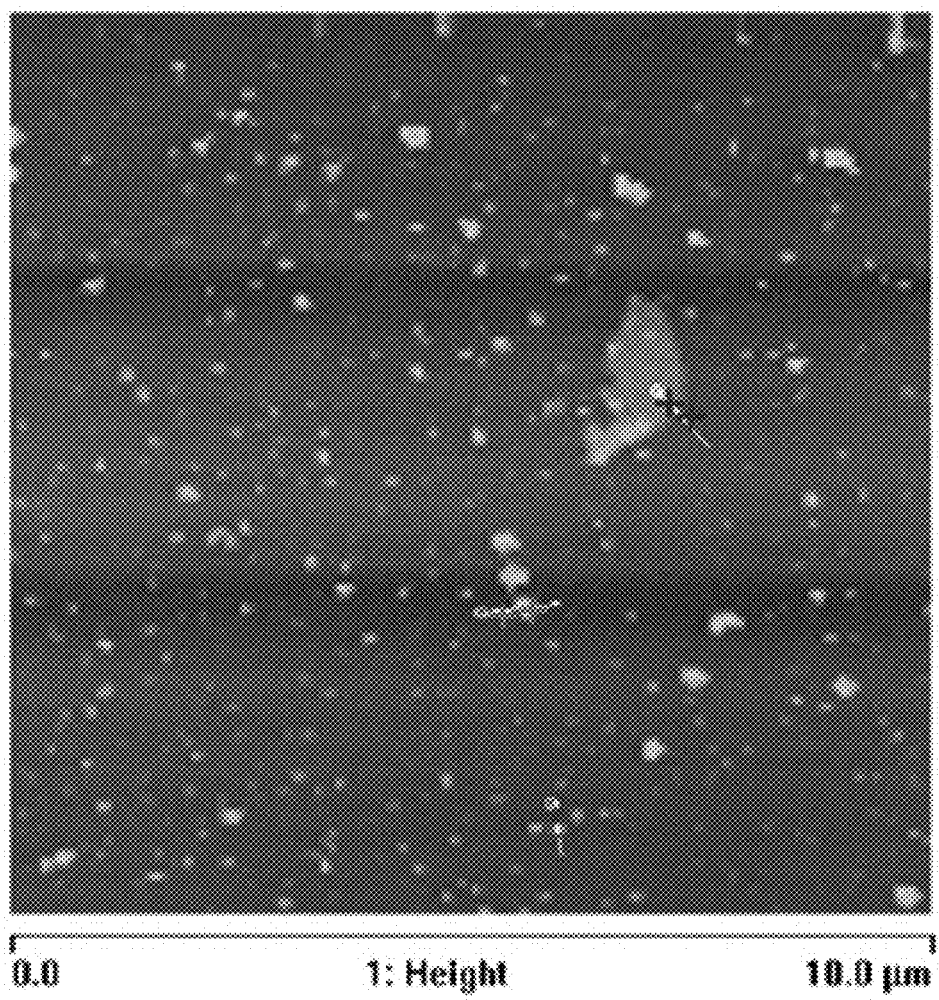
FIG. 6B is an atomic force microscope image of a ruthenium oxide nanosheet of Preparation Example 3.

An Atomic Force Microscope (AFM) is used to measure the thickness of the nanosheets, and the results are shown in FIG. 6B. Using the AFM, the thickness is measured for each of 20 nanosheets and the average thickness is determined to be 3.85 nm with a standard deviation of 1.34 nm.

Figure 19:
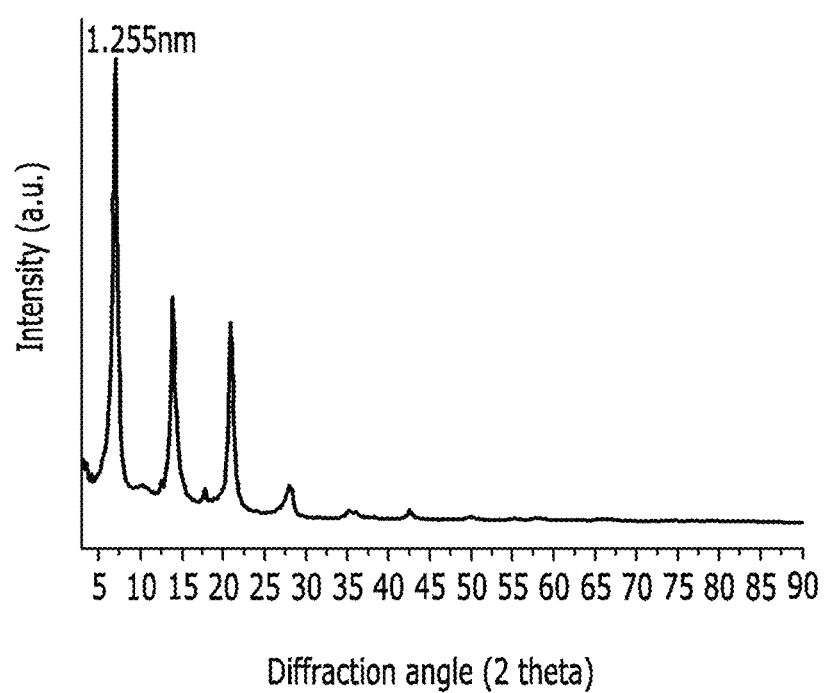
FIG. 19 is a graph of intensity (arbitrary units) versus diffraction angle ($2\theta$, degrees) which shows an X-ray diffraction spectrum of ruthenium oxide obtained from Preparation Example 3.

The obtained nanosheets are subjected to X-ray diffraction analysis, and the results thereof are shown in FIG. 19. From the results, the distance between the layers is determined to be 1.255 nm.

Preparation Example 4

Synthesis of Titanium Oxide Nanosheet via Exfoliation Using a Single Intercalant The titanium oxide nanosheets are prepared in the same manner as set forth in Preparation Example 2 except that for exfoliation, the obtained $H_{1.07}Ti_{1.73}O_4H_2O$ powder is introduced into 250 mL of an aqueous solution of tetrabutylammonium hydroxide (the concentration of TBAOH is TBA+/H+=2) and agitated for 10 d or longer.

Figure 20:
FIG. 20 is a scanning electron microscope image of the titanium oxide nanosheet layer (i.e., a second conductive layer) prepared in Preparation Example 4.

Results of Scanning Electron Microscopy (SEM) analysis are shown in FIG. 20, which confirms that the average lateral size of the nanosheets is 14.84 μm.

Example 1

Preparation of a Conductor Including a Nanowire Layer and a Ruthenium Oxide Nanosheets Layer

[1-1] A coating liquid including the $RuO_{2.1}$ nanosheets obtained from Preparation Example 1-1 and having the following composition is prepared.

Aqueous dispersion of the obtained $RuO_{2.1}$ nanosheets: 3 g

HPMC aqueous solution (0.3 wt %): 0.5 g

Isopropanol: 3 g

Water: 1 g

Figure 7A:
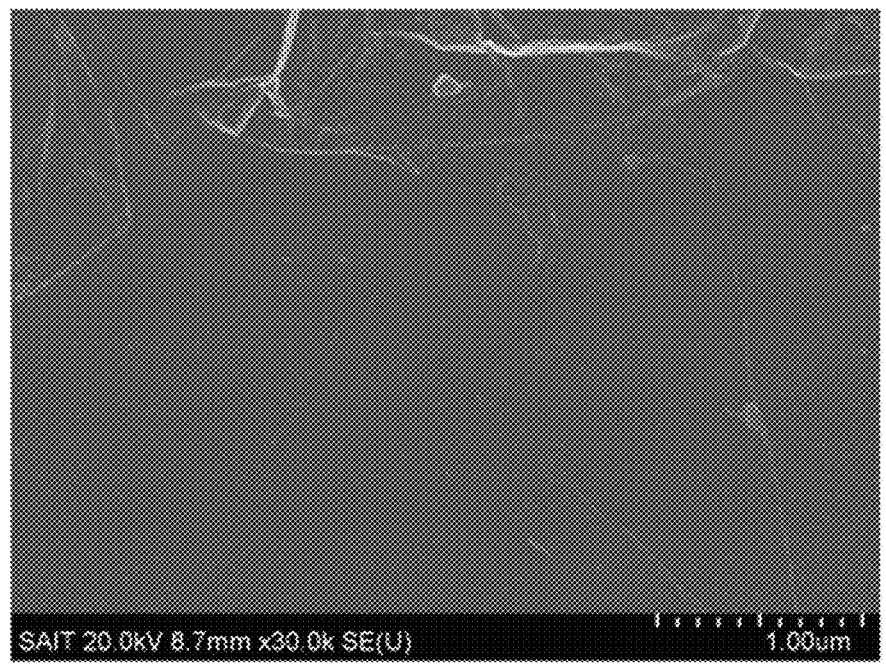
FIG. 7A and FIG. 7B are scanning electron microscope images of the ruthenium oxide nanosheet layer (i.e., a second conductive layer) prepared in Example 1.
Figure 7B:
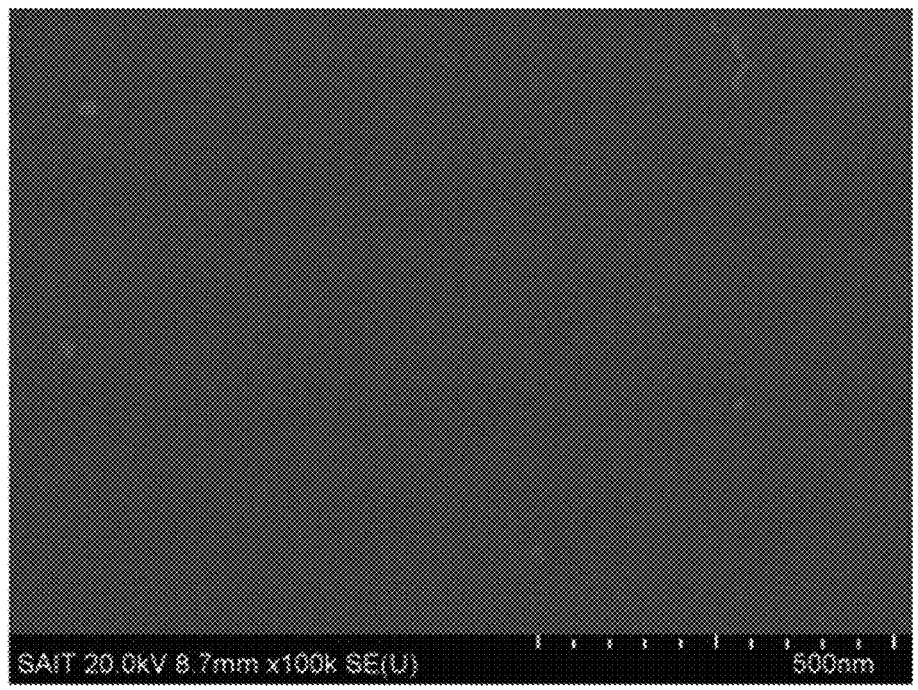

A small amount of TBAOH and TMAOH are detected from the obtained $RuO_{2.1}$ nanosheet coating liquid, which originate from the intercalants used for exfoliation of $RuO_{2.1}$ nanosheets. The $RuO_{2.1}$ nanosheet coating liquid is bar-coated on a polycarbonate substrate and dried at 85° C. under an air atmosphere. The processes are repeated 3 times to provide a second conductive layer. It is confirmed that the second conductive layer obtained by the bar coating has a thickness of about 1 to 5 nm. FIG. 7A and FIG. 7B show SEM images of the second conductive layer thus obtained. The sheet resistance of the obtained second conductive layer is measured by 4 point probe measurement (specimen size: width of 10 cm×length of 10 cm, measurement equipment manufactured by Mitsubishi Chemical Analytech, model name: MCP-T610). Transmittance is measured by using a haze meter (manufactured by Nippon Denshoku, model name: NDH-7000SP) considering only the material absorption except the light absorption of the substrate. As a result, the sheet resistance is $1.20 \times 10^5$ Ω/sq and the transmittance is 92.4%.

[1-2] A second conductive layer is prepared in the same manner set forth in item [1-1] except that a coating liquid including the $RuO_{2.1}$ nanosheets obtained from Preparation Example 1-2 is used. The sheet resistance and the transmittance of the second conductive layer are measured in the same manner as set forth above. As a result, the sheet resistance is 10571 Ω/sq and the transmittance is 93.7%.

[2] Ag nanowire containing coating liquid including the following components is prepared.

Ag nanowire aqueous solution (conc.; 0.5 wt %, the average diameter of the Ag nanowire=30 nm): 3 g Solvent: water 7 g and ethanol 3 g Binder: hydroxypropyl methyl cellulose aqueous solution (conc.: 0.3 wt %) 0.5 g The Ag nanowire-containing coating liquid is bar-coated on the second conductive layer and then is dried at 85° C. under an air atmosphere for one min to produce an electrical conductor.

Figure 8A:
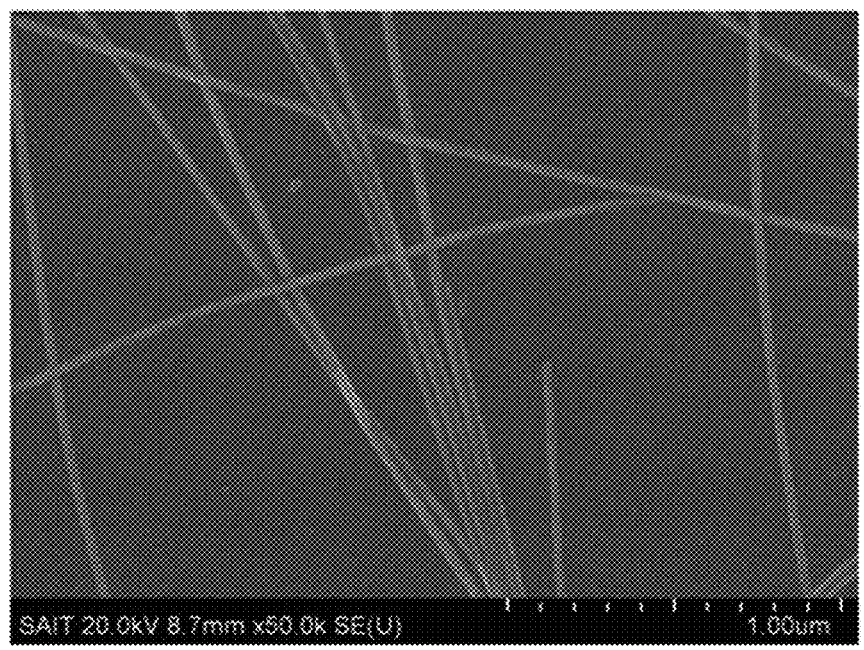
FIG. 8A and FIG. 8B are scanning electron microscope images of the conductor prepared in Example 1.
Figure 8B:
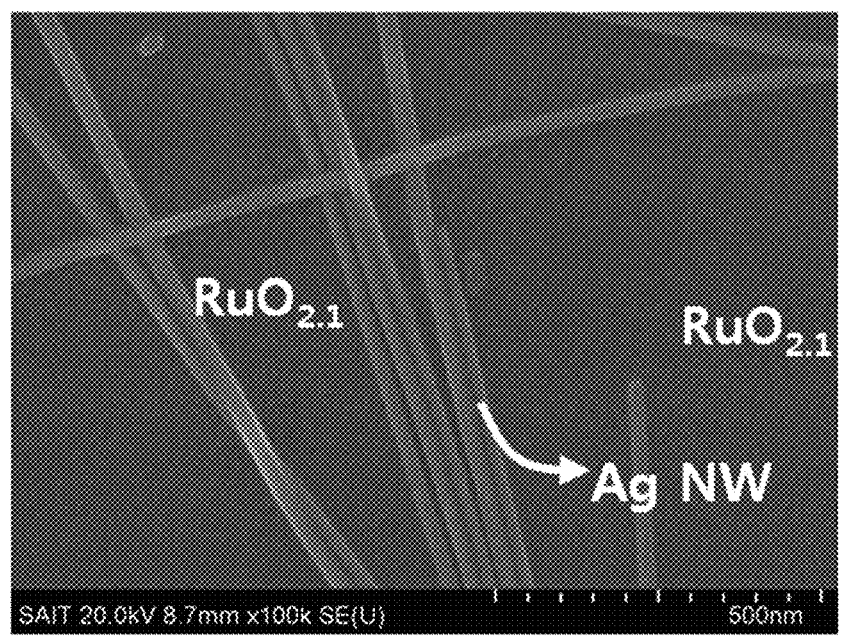

[3] A SEM analysis is conducted for the obtained electrical conductor and the results are shown in FIG. 8A and FIG. 8B, which confirm that the electrical conductor has a hybrid structure of the ruthenium oxide nanosheets/the silver nanowire.

The sheet resistance and the transmittance of the electrical conductor are measured in the same manner as set forth above. As a result, the sheet resistance is 33.39 Ω/sq and the transmittance is 89.1%.

Example 2

Preparation of an Electrical Conductor Including a Nanowire Layer and a Ruthenium Oxide Nanosheets Layer An electrical conductor having a hybrid structure is prepared in the same manner as Example 1, except for using the $RuO_{2.1}$ nanosheets obtained in Preparation Example 3.

Figure 9A:
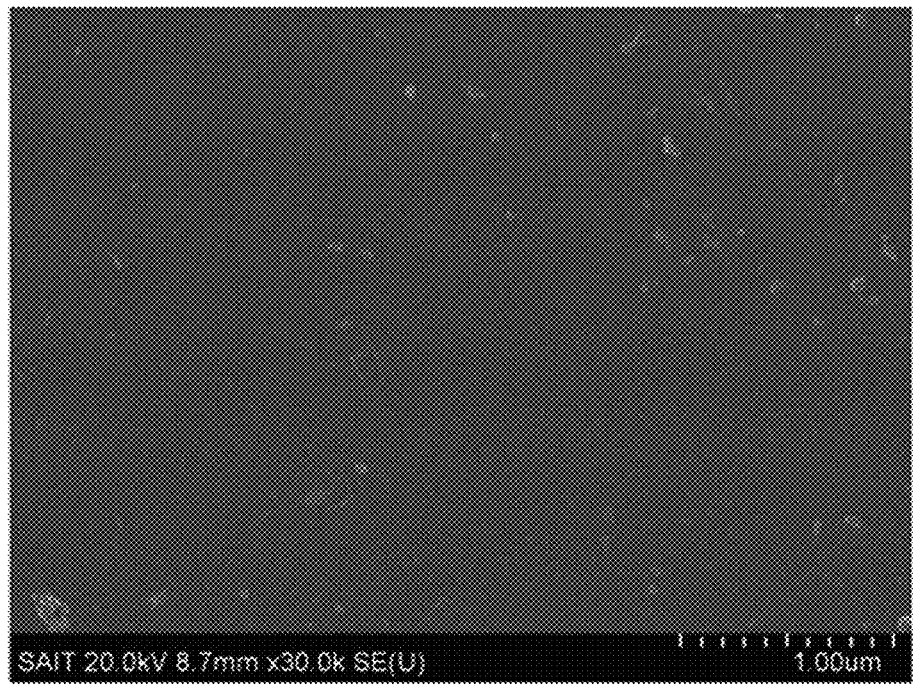
FIG. 9A and FIG. 9B are scanning electron microscope images of the ruthenium oxide nanosheet layer (i.e., a second conductive layer) prepared in Example 2.
Figure 9B:
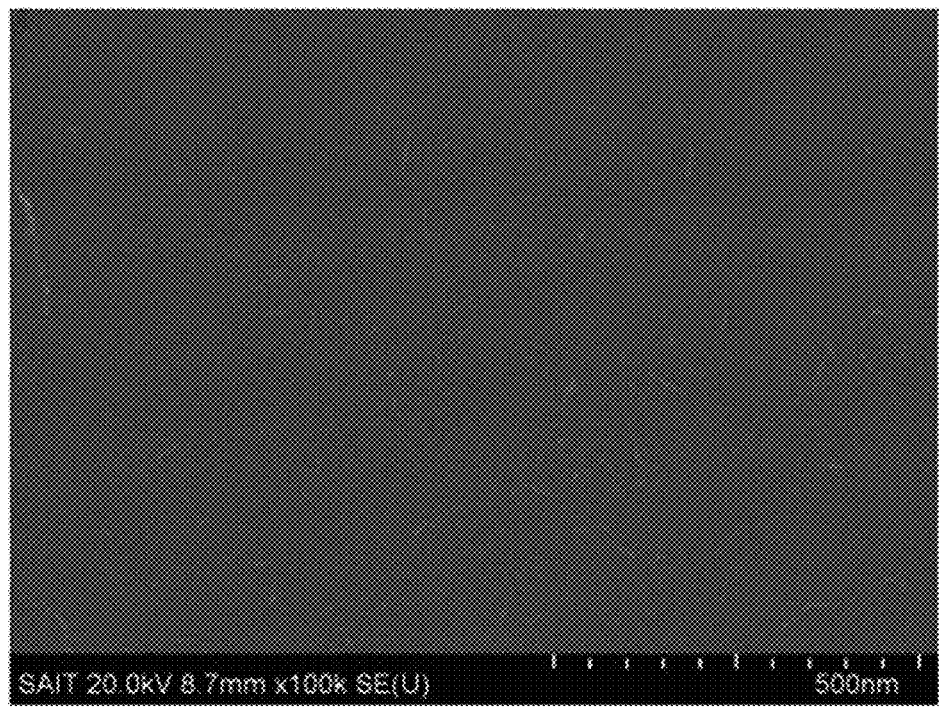

FIG. 9A and FIG. 9B show SEM images of the second conductive layer of the obtained electrical conductor. The sheet resistance of the obtained second conductive layer is measured by 4 point probe measurement and the sheet resistance is $2.35 \times 10^6$ Ω/sq. Transmittance is measured by using a haze meter (manufactured by Nippon Denshoku, model name: NDH-7000SP) considering only the material absorption except the light absorption of the substrate, and as a result, the transmittance is 91.7%.

Figure 10A:
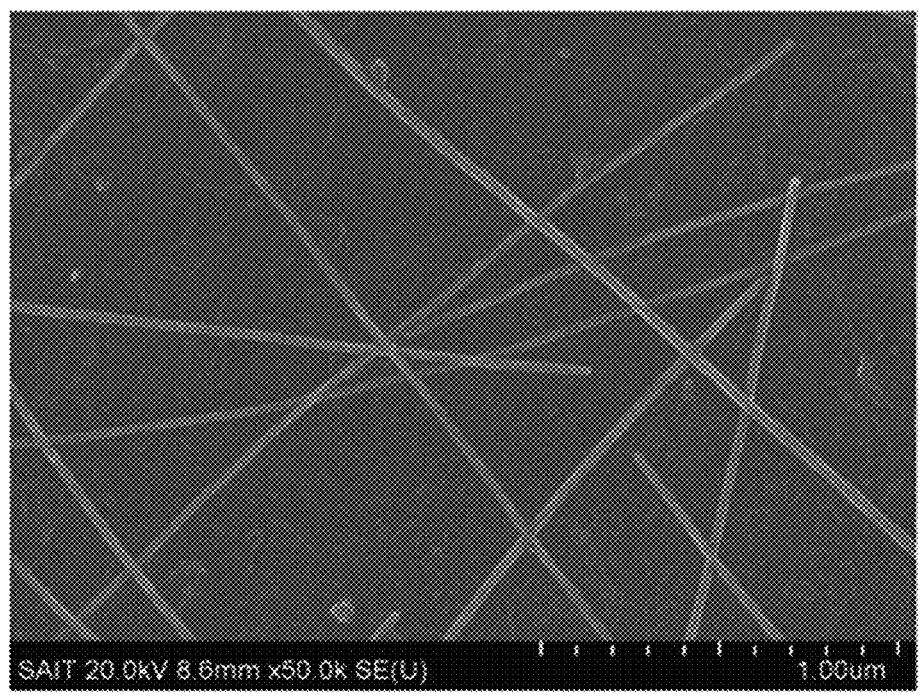
FIG. 10A and FIG. 10B are scanning electron microscope images of the conductor prepared in Example 2.
Figure 10B:
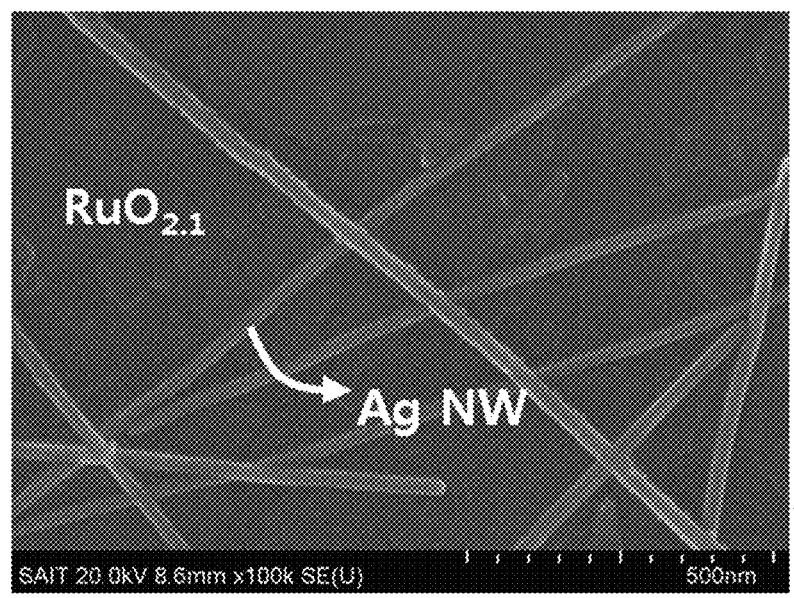

A SEM analysis is conducted for the obtained electrical conductor and the results are shown in FIG. 10A and FIG. 10B, which confirm that the electrical conductor has a hybrid structure of the ruthenium oxide nanosheets/the silver nanowire.

The sheet resistance and the transmittance of the electrical conductor are measured in the same manner set forth above. As a result, the sheet resistance is 36.41 Ω/sq and the transmittance is 89%.

Example 3

Preparation of an Electrical Conductor Including a Nanowire Layer and a Titanium Oxide Nanosheet Layer

[1] A coating liquid including the titanium oxide nanosheets obtained from Preparation Example 2 and having the following composition is prepared An aqueous dispersion of the obtained titanium oxide nanosheets: 3 g HPMC aqueous solution (0.3 wt %): 0.5 g Isopropanol: 0.5 g Water: 2 g A small amount of TBAOH and TMAOH is detected from the obtained titanium oxide nanosheet coating liquid, which originate from the intercalants used for exfoliation of titanium oxide nanosheets.

The titanium oxide nanosheet coating liquid is bar-coated on a polycarbonate substrate and dried at 85° C. under an air atmosphere. The processes are repeated 3 times to provide a second conductive layer. The transmittance of the second conductive layer is measured considering the absorption of the material without the light absorption of the substrate to be 100%.

[2] A Ag nanowire-containing coating liquid is prepared as in Example 1. The Ag nanowire-containing coating liquid is bar-coated on the second conductive layer and then is dried at 85° C. under an air atmosphere for one min to produce an electrical conductor.

Figure 11:
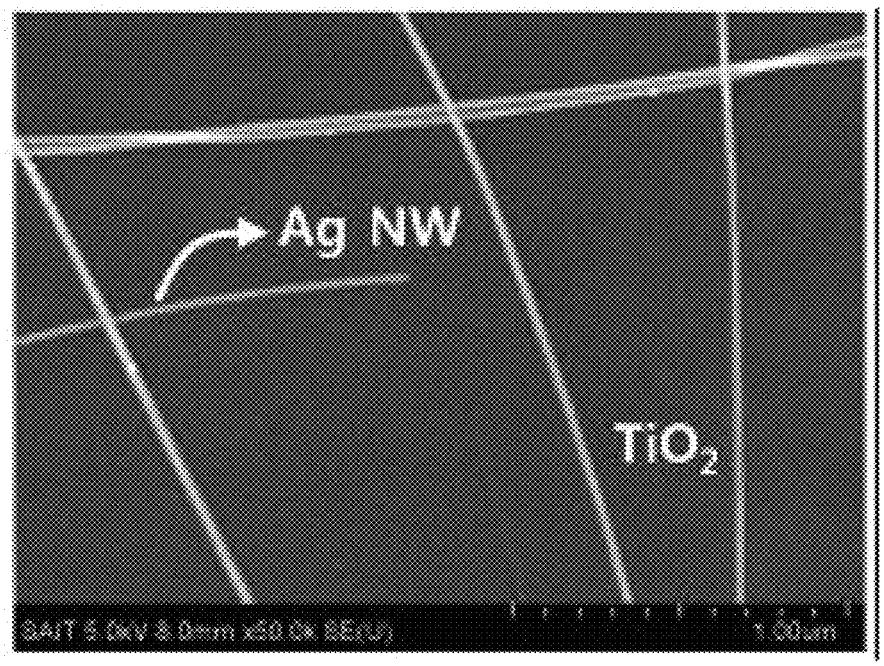
FIG. 11 is a scanning electron microscope image of the conductor prepared in Example 3.

[3] A SEM analysis is conducted for the obtained electrical conductor and the results are shown in FIG. 11, which confirms that the electrical conductor has a hybrid structure of the titanium oxide nanosheets/the silver nanowire.

The sheet resistance and the transmittance of the electrical conductor are measured in the same manner as set forth above. As a result, the sheet resistance is 39.24 Ω/sq and the transmittance is 98.9%.

Example 4

Preparation of an Electrical Conductor Including a Nanowire Layer and a Titanium Oxide Nanosheet Layer An electrical conductor having a hybrid structure is prepared in the same manner as Example 3, except for using the titanium oxide nanosheets obtained in Preparation Example 4.

Figure 12:
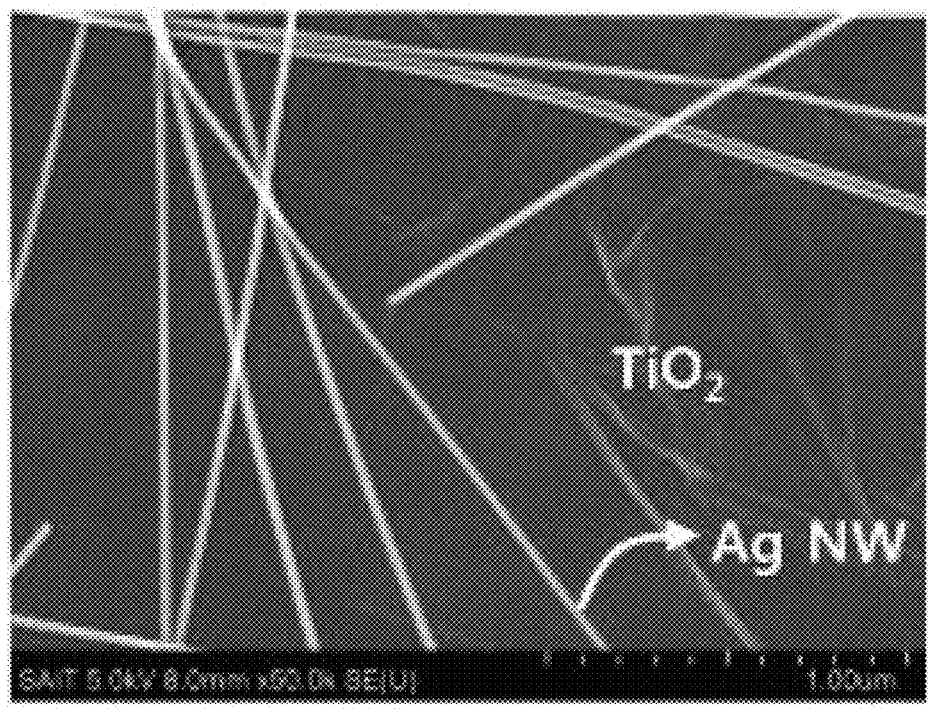
FIG. 12 is a scanning electron microscope image of the conductor prepared in Example 4.

A SEM analysis is conducted for the obtained electrical conductor and the results are shown in FIG. 12, which confirms that the electrical conductor has a hybrid structure of the titanium oxide nanosheets/the silver nanowire.

The sheet resistance and the transmittance of the electrical conductor are measured in the same manner as set forth above. As a result, the sheet resistance is 66.77 Ω/sq and the transmittance is 98.9%.

Comparative Example 1

Preparation of an Electrical Conductor Including a Silver Nanowire Layer Only

Figure 13:
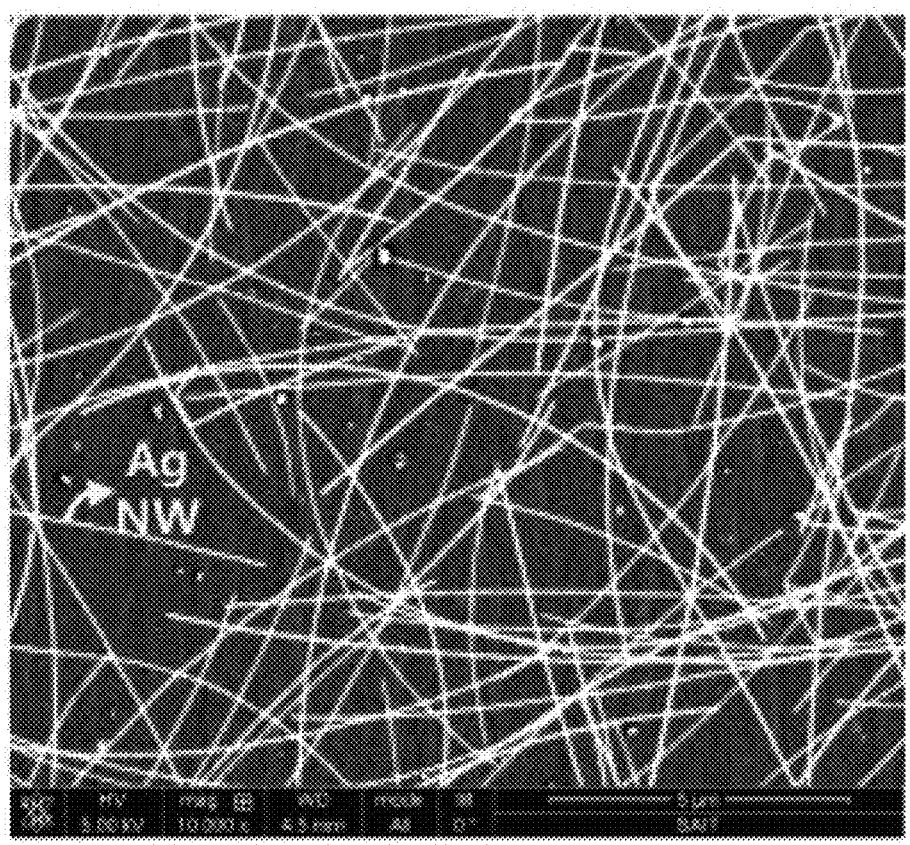
FIG. 13 is a scanning electron microscope image of the conductor prepared in Comparative Example 1.

An Ag nanowire-containing coating liquid including the following components is prepared as Example 1. The Ag nanowire-containing coating liquid is bar-coated on a polycarbonate substrate and then is dried at 85° C. under an air atmosphere for one min to produce an electrical conductor having the first conductive layer. The SEM image of the obtained electrical conductor is shown in FIG. 13.

The sheet resistance and the transmittance of the electrical conductor are measured in the same manner as set forth above. As a result, the sheet resistance is 38.4 Ω/sq and the transmittance is 99.2%.

Example 5

Evaluation of Flexibility of the Electrical Conductors Having the Hybrid Structure

[1] The flexibility of the electrical conductor having the hybrid structure is evaluated by the calculation of the silver nanowire (hereinafter, which may be referred to as "wire") random network sheet resistance based on the following steps.

The silver nanowire random network is made by randomly designating the central coordinates (x, y) and angle θ of wire in the square simulation domain using MATLAB.

For the wires made in the aforementioned manner, it is determined whether they meet another wire in the network using a formula for calculating a distance between two straight lines, and thereby the wire contact information is stored.

A cluster of wires through which the current may flow from the wire contacting the left end of square simulation domain to the wire contacting the right end without stopping is determined using the stored inter-contact information between the wires.

While considering the resistance of Ag NW itself and the contact resistance between the wires for all the wire contact points (junction) in each cluster, a linear equation is established by applying the Kirchhoff current law.

In this case, the linear equation is transformed in order to apply a 2D hybrid wherein the NW junction deformed by bending is a model flowing through 2D sheet, and the 2D sheet is assumed to have 100% coverage.

In a delamination model wherein the wire is not cut, it is assumed that some of inter-wire junctions are spaced, and current is flowed through the 2D sheet instead of the spaced contact and thus the contact resistance of the linear equation corresponding the spaced junction is changed to the 2D sheet resistance.

Figure 14:
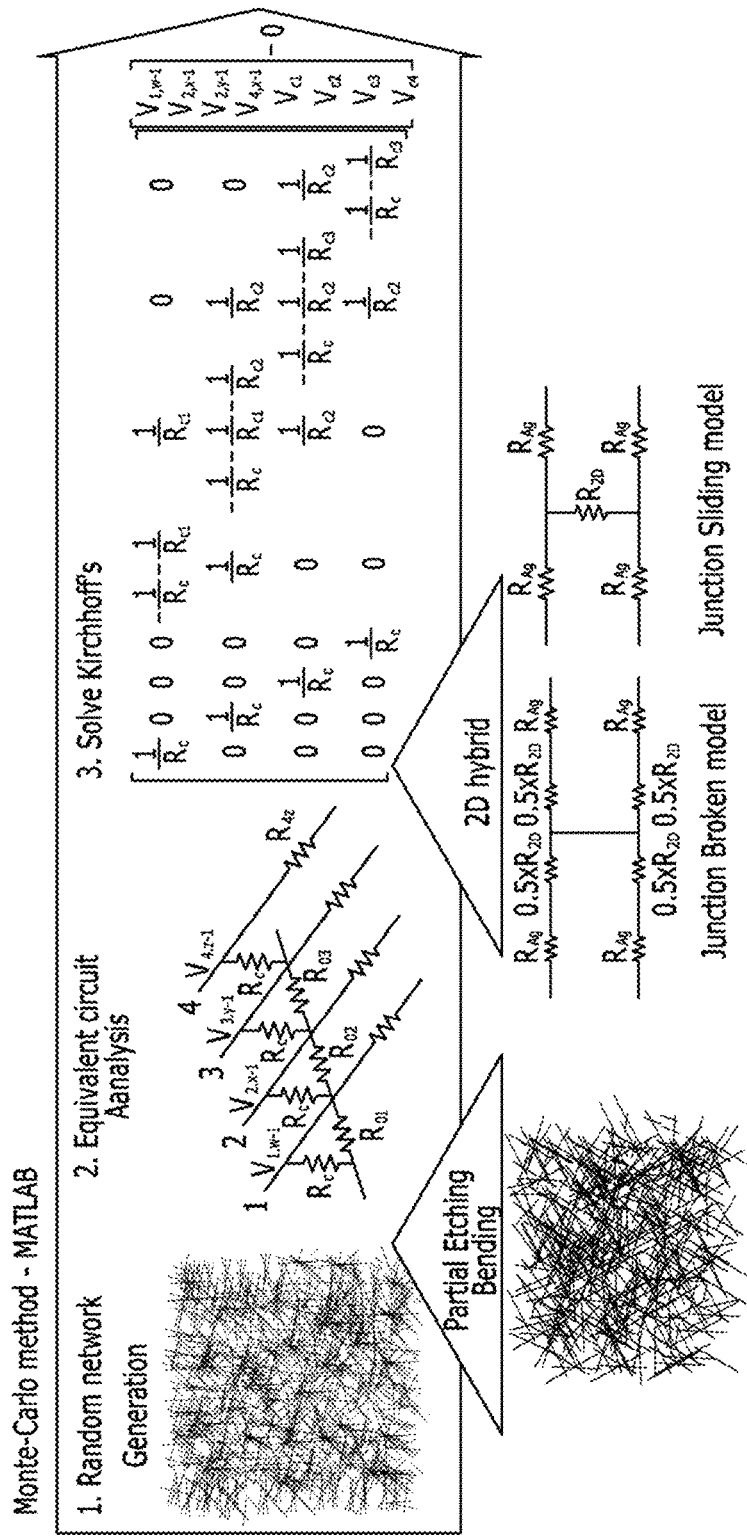
FIG. 14 is a schematic illustration the simulation method carried out in Example 5.

In a broken junction model wherein the wire is cut, the linear equation is transformed by removing the contract resistance of the linear equation corresponding to the broken junction and adding the resistance corresponding to half of the 2D sheet to the broken wire resistance in series (referring to FIG. 14).

The linear equation is solved as many times as the number of junctions to calculate the value of the current flowing when a 1 V voltage is applied from left to right of the square simulation domain, and based on this current value, the sheet resistance of the Ag NW network is calculated.

Figure 15:
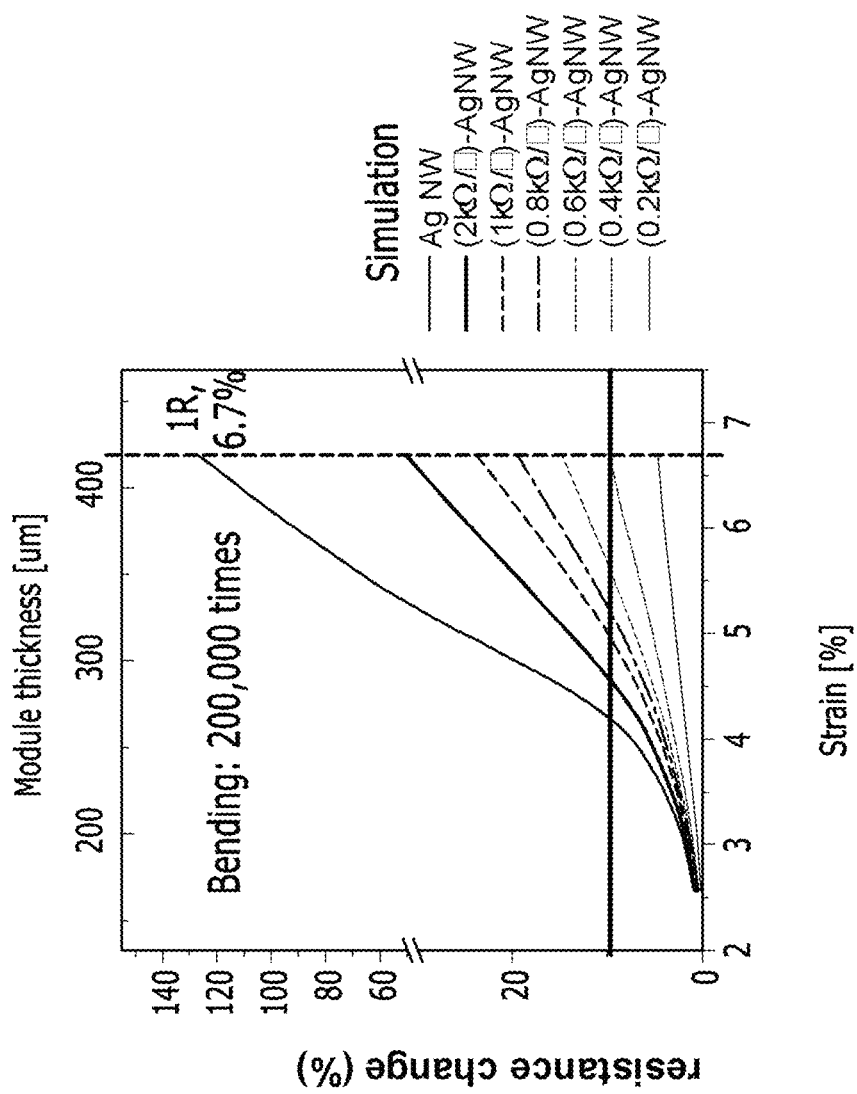
FIG. 15 is a graph of resistance change (percent, %) versus strain (percent, %) and module thickness (micrometers, $\mu m$) showing the simulation results of Example 5.

[2] From the results of FIG. 15, it is confirmed that the conductor having a nanowire/nanosheet hybrid structure may show an improved resistance change compared to the conductor having only the nanowire, when the 2D nanosheet layer having predetermined sheet resistance is present.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. An electrical conductor comprising:
a first conductive layer comprising a plurality of metal nanowires;
a second conductive layer disposed on a surface of the first conductive layer, wherein the second conductive layer comprises a plurality of metal oxide nanosheets; and
a substrate disposed on a surface of the second conductive layer which is opposite the first conductive layer,
wherein in the first conductive layer a metal nanowire of the plurality of metal nanowires contacts at least two metal oxide nanosheets of the plurality of metal oxide nanosheets, and
wherein at least two metal oxide nanosheets of the plurality of metal oxide nanosheets contact with each other to provide an electrical connection between contacting metal oxide nanosheets.

2. The electrical conductor of claim 1, wherein the metal nanowires comprise silver, copper, gold, aluminum, cobalt, palladium, or a combination thereof.

3. The electrical conductor of claim 1, wherein the electrical conductor is a transparent conductive film.

4. The electrical conductor of claim 1, wherein the metal nanowire has a diameter of less than or equal to about 50 nanometers and a length of greater than or equal to about 1 micrometer.

5. The electrical conductor of claim 1, wherein the metal oxide nanosheets have an average lateral dimension of greater than or equal to about 0.1 micrometer and less than or equal to about 100 micrometer, and have an average thickness of less than or equal to about 3 nanometers.

6. The electrical conductor of claim 1, wherein the second conductive layer is a discontinuous layer including an open space between the metal oxide nanosheets, and an area ratio of the open space with respect to a total area of the second conductive layer is less than or equal to about 50%.

7. The electrical conductor of claim 1, wherein a metal nanowire of the plurality of metal nanowires of the first conductive layer extends across an open space of the second conductive layer.

8. The electrical conductor of claim 1, wherein the electrical conductor has sheet resistance of less than or equal to about 100 ohms per square and transmittance of greater than or equal to about 85 percent with respect to light of a wavelength of 550 nanometers when it has a thickness of 100 nanometers or less.

9. The electrical conductor of claim 1, wherein the metal oxide nanosheets comprise $Ti_xO_2$ wherein x is 0.8 to 1, $Ti_3O_7$, $Ti_4O_9$, $Ti_5O_{11}$, $Ti_{1-x}Co_xO_2$ wherein $0<x\le0.2$, $Ti_{1-x}Fe_xO_2$ wherein $0<x\le0.4$, $Ti_{1-x}Mn_xO_2$ wherein $0<x\le0.4$, $Ti_{0.8-x/4}Fe_{x/2}Co_{0.2-x/4}O_2$ wherein x is 0.2, 0.4, or 0.6, $MnO_2$, $Mn_3O_7$, $Mn_{1-x}Co_xO_2$ wherein $0<x\le0.4$, $Mn_{1-x}Fe_xO_2$ wherein $0<x\le0.2$, $TiNbO_5$, $Ti_2NbO_7$, $TiTaO_5$, $Nb_3O_8$, $Nb_6O_{17}$, $TaO_3$, $LaNb_2O_7$, $La_{0.90}Eu_{0.05}Nb_2O_7$, $Eu_{0.56}Ta_2O_7$, $SrTa_2O_7$, $Bi_2SrTa_2O_9$, $Ca_2Nb_3O_{10}$, $Sr_2Nb_3O_{10}$, $NaCaTa_3O_{10}$, $CaLaNb_2TiO_{10}$, $La_2Ti_2NbO_{10}$, $Ba_5Ta_4O_{15}$, $W_2O_7$, $RuO_{2+x}$ wherein $0\le x\le0.5$, $Cs_4W_{11}O_{36}$, or a combination thereof.

10. The electrical conductor of claim 1, wherein at least one of the first conductive layer and the second conductive layer further comprises a binder.

11. The electrical conductor of claim 1, wherein the electrical conductor further comprises an overcoating layer comprising a thermosetting resin, an ultraviolet-curable resin, or a combination thereof on the first conductive layer.

12. The electrical conductor of claim 1, wherein the electrical conductor has a resistance change of less than or equal to about 60 percent when it is folded to have a curvature radius of 1 millimeter.

13. The electrical conductor of claim 1, wherein a metal oxide nanosheet of the plurality of metal oxide nanosheets has a thickness of greater than about 1 nanometer and less than or equal to about 3 nanometers.

14. An electronic device comprising the electrical conductor of claim 1.

15. The electronic device of claim 14, wherein the electronic device is a flat panel display, a touch screen panel, a solar cell, an e-window, an electrochromic mirror, a heat mirror, a transparent transistor, or a flexible display.

16. An electrical conductor comprising:
a first conductive layer comprising a plurality of metal nanowires, and
a second conductive layer disposed on a surface of the first conductive layer, wherein the second conductive layer comprises a plurality of metal oxide nanosheets, wherein in the first conductive layer a metal nanowire of the plurality of metal nanowires contacts at least two metal oxide nanosheets of the plurality of metal oxide nanosheets, wherein at least two metal oxide nanosheets of the plurality of metal oxide nanosheets contact with each other to provide an electrical connection between contacting metal oxide nanosheets, and wherein the metal oxide nanosheets comprise at least two types of C1 to C16 alkyl ammonium ions on a surface thereof.

17. The electrical conductor of claim 16, wherein the metal oxide nanosheets comprise a tetramethyl ammonium ion and a tetrabutyl ammonium ion on a surface thereof.

18. A one-dimensional-two-dimensional hybrid structure comprising:
- a nanosheet layer comprising a plurality of metal oxide nanosheets,
- a nanowire layer disposed on the nanosheet layer and comprising a plurality of metal nanowires, and
- a substrate disposed on a surface of the nanosheet layer which is opposite the nanowire layer,
- wherein in the nanowire layer a metal nanowire of the plurality of metal nanowires contacts at least two metal oxide nanosheets of the plurality of metal oxide nanosheets, and
- wherein the plurality of metal oxide nanosheets in the nanosheet layer comprises an electrical connection between contacting metal oxide nanosheets.

19. The one-dimensional-two-dimensional hybrid structure of claim 18, wherein a metal oxide nanosheet of the plurality of metal oxide nanosheets has a thickness of greater than about 1 nanometer and less than or equal to about 3 nanometers.

20. A heating element comprising an electrical conductor, wherein the electrical conductor comprises a first conductive layer comprising a plurality of metal nanowires; a second conductive layer disposed on a surface of the first conductive layer; and a substrate disposed on a surface of the second conductive layer which is opposite the first conductive layer,
- wherein the second conductive layer comprises a plurality of metal oxide nanosheets,
- wherein in the first conductive layer a metal nanowire of the plurality of metal nanowires contacts at least two metal oxide nanosheets of the plurality of metal oxide nanosheets, and
- wherein the plurality of metal oxide nanosheets comprises an electrical connection between contacting metal oxide nanosheets.

* * * * *